(12) United States Patent
Belyansky et al.

(10) Patent No.: US 10,586,700 B2
(45) Date of Patent: Mar. 10, 2020

(54) PROTECTION OF LOW TEMPERATURE ISOLATION FILL

(71) Applicant: International Business Machines Corporation, Armonk, NY (US)

(72) Inventors: Michael P. Belyansky, Halfmoon, NY (US); Richard A. Conti, Katonach, NY (US); Dechao Guo, Niskayuna, NY (US); Devendra K. Sadana, Pleasantville, NY (US); Jay W. Strane, Warwick, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/815,111

(22) Filed: Nov. 16, 2017

(65) Prior Publication Data

US 2019/0067079 A1 Feb. 28, 2019

Related U.S. Application Data

(63) Continuation of application No. 15/688,154, filed on Aug. 28, 2017.

(51) Int. Cl.
*H01L 21/02* (2006.01)
*H01L 21/762* (2006.01)
(Continued)

(52) U.S. Cl.
CPC .... *H01L 21/02356* (2013.01); *H01L 21/0234* (2013.01); *H01L 21/02126* (2013.01);
(Continued)

(58) Field of Classification Search
CPC ............. H01L 21/762; H01L 21/02225; H01L 21/02126; H01L 21/0226; H01L 21/02356;
(Continued)

(56) References Cited

U.S. PATENT DOCUMENTS 6,500,728 B1   12/2002  Wang
6,566,278 B1    5/2003  Harvey et al.
(Continued)

FOREIGN PATENT DOCUMENTS

CN     102214676 A    10/2011
CN     103377980 A    10/2013

OTHER PUBLICATIONS

Belyansky, et al., "Protection of Low Temperature Isolation Fill", U.S. Appl. No. 15/688,154, filed Aug. 28, 2017.
(Continued)

*Primary Examiner* — Scott B Geyer
(74) *Attorney, Agent, or Firm* — Cantor Colburn LLP; Vazken Alexanian

(57) ABSTRACT

A semiconductor structure includes a plurality of semiconductor fins on an upper surface of a semiconductor substrate. The semiconductor fins spaced apart from one another by a respective trench to define a fin pitch. A multi-layer electrical isolation region is contained in each trench. The multi-layer electrical isolation region includes an oxide layer and a protective layer. The oxide layer includes a first material on an upper surface of the semiconductor substrate. The protective layer includes a second material on an upper surface of the oxide layer. The second material is different than the first material. The first material has a first etch resistance and the second material has a second etch resistance that is greater than the first etch resistance.

17 Claims, 18 Drawing Sheets

(51) Int. Cl.
*H01L 29/66* (2006.01)
*H01L 21/3115* (2006.01)
*H01L 21/3105* (2006.01)
*H01L 29/78* (2006.01)

(52) U.S. Cl.
CPC .. *H01L 21/02225* (2013.01); *H01L 21/02321* (2013.01); *H01L 21/02332* (2013.01); *H01L 21/3105* (2013.01); *H01L 21/31155* (2013.01); *H01L 21/762* (2013.01); *H01L 21/76224* (2013.01); *H01L 29/66795* (2013.01); *H01L 29/66818* (2013.01); *H01L 29/785* (2013.01); H01L 21/0226 (2013.01)

(58) Field of Classification Search
CPC ......... H01L 21/02359; H01L 21/02321; H01L 21/76224
See application file for complete search history.

(56) References Cited

U.S. PATENT DOCUMENTS

| | | | |
|---|---|---|---|
| 6,756,085 | B2 | 6/2004 | Waldfried |
| 7,148,155 | B1 | 12/2006 | Tarafdar |
| 7,361,565 | B2 | 4/2008 | Shin et al. |
| 7,622,369 | B1 | 11/2009 | Lee |
| 7,790,051 | B1* | 9/2010 | Carroll ................. B82B 3/0071 216/87 |
| 7,803,722 | B2 | 9/2010 | Liang |
| 8,187,948 | B2 | 5/2012 | Chen |
| 8,318,584 | B2 | 11/2012 | Li et al. |
| 8,319,311 | B2 | 11/2012 | Chen |
| 8,809,161 | B2 | 8/2014 | Gauri |
| 9,589,829 | B1* | 3/2017 | Cao ................... H01L 21/76224 |
| 9,875,936 | B1* | 1/2018 | Sporer ............ H01L 21/823431 |
| 2003/0022453 | A1 | 1/2003 | Park |
| 2005/0196935 | A1 | 9/2005 | Ishitsuka et al. |
| 2007/0187683 | A1* | 8/2007 | Forbes ............. H01L 21/02664 257/65 |
| 2009/0098706 | A1 | 4/2009 | Kim et al. |
| 2009/0170281 | A1 | 7/2009 | Cho et al. |
| 2010/0102377 | A1 | 4/2010 | Iikawa et al. |
| 2011/0065276 | A1* | 3/2011 | Ganguly ............. H01L 21/0223 438/694 |
| 2012/0223407 | A1* | 9/2012 | Scheiper ......... H01L 21/823437 257/506 |
| 2013/0043563 | A1 | 2/2013 | Nakazawa |
| 2013/0214381 | A1 | 8/2013 | Kronholz |
| 2013/0230987 | A1 | 9/2013 | Draeger |
| 2013/0288485 | A1* | 10/2013 | Liang ................ H01L 21/02282 438/782 |
| 2014/0175554 | A1* | 6/2014 | Loubet ........... H01L 21/823431 257/368 |
| 2014/0374838 | A1 | 12/2014 | Chen et al. |
| 2016/0163832 | A1 | 6/2016 | Yin et al. |
| 2018/0096895 | A1* | 4/2018 | Sung ............. H01L 21/823481 |
| 2018/0277658 | A1 | 9/2018 | Yun et al. |

OTHER PUBLICATIONS

List of IBM Patents or Patent Applications Treated as Related; Nov. 16, 2017, 2 pages.

International Search Report and Written Opinion for International Application No. PCT/IB2018/055863; Application filing date Aug. 3, 2018; dated Dec. 5, 2018 (6 pages).

* cited by examiner

PROTECTION OF LOW TEMPERATURE ISOLATION FILL

DOMESTIC PRIORITY

This application is a continuation of U.S. patent application Ser. No. 15/688,154, filed Aug. 28, 2017, the disclosure of which is incorporated by reference herein in its entirety.

BACKGROUND

The present invention generally relates to semiconductor fabrication methods and devices. More specifically, the present invention relates to techniques to protect low temperature isolation materials that form high aspect ratio elements (e.g., isolation regions) of a semiconductor device.

The advancement in semiconductor integrated circuit technology has facilitated continuous reduction of the physical footprint and dimensions of semiconductor devices formed on semiconductor wafers. As a result, circuit density also continues to increase per chip. For a given chip size, active circuit components, e.g., semiconductor devices, are typically placed in close proximity to each other to maximize circuit density. Electrical isolation regions such as shallow trench isolation (STI) regions are typically formed in the wafer to electrically isolate neighboring semiconductor devices from one another.

SUMMARY

Embodiments of the present invention are directed to a method of fabricating a semiconductor device. The method includes forming a plurality of semiconductor fins on an upper surface of a semiconductor substrate. The semiconductor fins are spaced apart from one another by a respective trench to define a fin pitch. The method further includes depositing a gap filling isolation material in the trenches. The oxide material has a first etch resistance. The method further includes converting a portion of the isolation material into a different second isolation material that defines a protective layer having a second etch resistance that is greater than the first etch resistance. The method further includes annealing the converted second material to further increase the second etch resistance. The annealing operation includes exposing the converted second material to an annealing temperature that is below 900 degrees Celsius (° C.).

One or more additional embodiments of the present invention are directed to a semiconductor structure that includes a plurality of semiconductor fins on an upper surface of a semiconductor substrate. The semiconductor fins spaced apart from one another by a respective trench to define a fin pitch. A multi-layer electrical isolation region is contained in each trench. The multi-layer electrical isolation region includes an oxide layer and a protective layer. The oxide layer includes a first material on an upper surface of the semiconductor substrate. The protective layer includes a second material on an upper surface of the oxide layer. The second material is different than the first material.

One or more additional embodiments of the present invention are directed to another method of fabricating a semiconductor device, the method including forming a plurality of semiconductor fins on an upper surface of a semiconductor substrate. The semiconductor fins are spaced apart from one another by a respective trench to define a fin pitch. The method further includes depositing a gap filling oxide material in the trenches. The oxide material has a first material etch rate. The method further includes implanting silicon ions into the oxide material to convert a portion of the oxide material into a different second material that defines a protective layer having a second material etch rate that is lower than the first material etch rate.

One or more additional embodiments of the present invention are directed to another method of fabricating a semiconductor device. The method comprises forming a plurality of semiconductor fins on an upper surface of a semiconductor substrate. The semiconductor fins are spaced apart from one another by a respective trench to define a fin pitch. The method further includes depositing an oxide material in the trenches to form an oxide layer. The oxide material has a first etch resistance. The method further includes performing an ion implantation process to implant ions into the oxide material to convert a portion of the oxide layer into a second material to form a first protective layer having a second etch resistance that is different from the first etch resistance. The method further includes applying a high density plasma (HDP) to a surface of the first protective layer to convert a portion of the first protective layer into a third material that is different from the oxide material and the second material. The third material serves as a second protective layer having a third etch resistance that is different from the first and second etch resistances. The method further includes annealing the structure at temperatures below 900° C. to further increase the etch resistance of both second material and the third material. A combination of the annealed second material and the annealed third material defines a multi-layer electrical isolation region.

One or more additional embodiments of the present invention are directed to another semiconductor structure that includes a plurality of semiconductor fins on an upper surface of a semiconductor substrate. The semiconductor structure comprises a plurality of semiconductor fins on an upper surface of a semiconductor substrate. The semiconductor fins are spaced apart from one another by a respective trench to define a fin pitch. An oxide material is located in the trenches to define an oxide layer. The oxide material has a first etch resistance. A second material different from the oxide material is located on an upper surface of the oxide layer to define a first protective layer. A third material is located on an upper surface of the first protective layer. The third material is different from the oxide material and the second material to define a second protective layer. A combination of the oxide layer, the first protective layer and the second protective layer defines a multi-layer electrical isolation region that electrically isolates the plurality semiconductor fins from one another. Each of the oxide layer, the first protective layer and the second protective layer having different etch resistances with respect to one another.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

Figure 1:
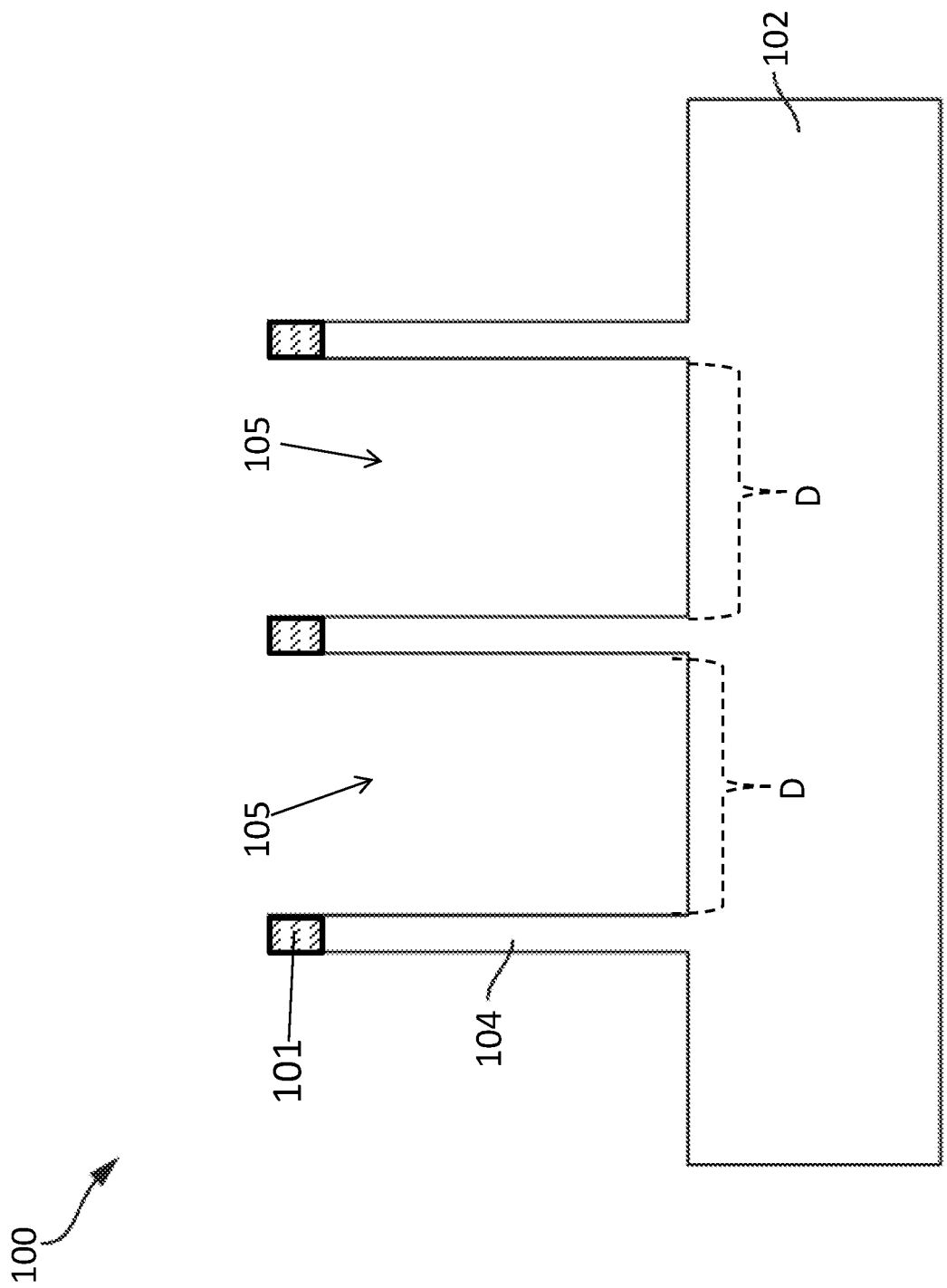
FIG. 1 illustrates a semiconductor structure according to a non-limiting embodiment of the invention.

The diagrams depicted herein are illustrative. There can be many variations to the diagram or the operations described therein without departing from the spirit of the invention. For instance, the actions can be performed in a differing order or actions can be added, deleted or modified. Also, the term "coupled" and variations thereof describes having a communications path between two elements and does not imply a direct connection between the elements with no intervening elements/connections between them. All of these variations are considered a part of the specification.

In the accompanying figures and following detailed description of the described embodiments, the various elements illustrated in the figures are provided with two or three digit reference numbers. With minor exceptions, the leftmost digit(s) of each reference number correspond to the figure in which its element is first illustrated.

DETAILED DESCRIPTION

Various embodiments of the invention are described herein with reference to the related drawings. Alternative embodiments of the invention can be devised without departing from the scope of this invention. Various connections and positional relationships (e.g., over, below, adjacent, etc.) are set forth between elements in the following description and in the drawings. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. Moreover, the various tasks and process steps described herein can be incorporated into a more comprehensive procedure or process having additional steps or functionality not described in detail herein.

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" can include any integer number greater than or equal to one, i.e. one, two, three, four, etc. The terms "a plurality" can be understood to include any integer number greater than or equal to two, i.e. two, three, four, five, etc. The term "connection" can include both an indirect "connection" and a direct "connection."

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

For the sake of brevity, conventional techniques related to making and using aspects of the invention may or may not be described in detail herein. Accordingly, in the interest of brevity, many conventional implementation details and fabrication techniques are only mentioned briefly herein or are omitted entirely without providing the well-known system and/or process details.

Turning now to an overview of technologies that are more specifically relevant to aspects of the invention, the process of forming electrical insulation or isolation regions, such as shallow trench isolation (STI) regions, involves forming insulator-filled trenches between active semiconductor components and/or conductive lines. The trenches have an aspect ratio that is typically defined as the measured trench height with respect to the measured trench width. However, as circuit densities continue to increase, the dimensions of these trenches decrease thereby increasing the aspect ratio of the trenches. As a result, filling these narrower trenches (referred to as high-aspect ratio trenches) becomes more difficult and can lead to unwanted voids and discontinuities in the insulating or trench-fill material.

The presence of high aspect ratio semiconductor components and device elements such as high aspect ratio STI regions, for example, has resulted in the utilization of various high aspect ratio trench filling techniques. One such technique for forming a high aspect ratio STI region includes filling a high aspect ratio trench with a low-temperature oxide material which reduces the formation of voids and discontinuities. Although STI region formation is described herein, it should be appreciated that the above-mentioned techniques can be applicable to other isolation layers beyond STI, for example for isolation between transistor gates in middle of line.

The low-temperature oxide material is typically, silicon oxide, but is not limited to silicon oxide. Typically, a gap filling technique is used for isolation film deposition, which is capable of filling narrow trenches. For example, the spin-on material or the CVD process which allows the isolation material to become fluid and flowable is used to fill the narrow gap in conjunction with non-conformal high density plasma deposition (HDP). Such deposition methods are capable of filling narrow trenches "bottom-up". Excepting HDP CVD, these low-temperature oxide materials, however, typically have low-etch resistance and therefore can be unintentionally over-etched or pulled-down when performing subsequent cleaning techniques or other downstream fabrication processes. The unintentional pull-down of the resulting STI region can cause device defects and undesirable device variability.

In addition, traditional low temperature isolation materials typically have relatively poor density and high wet etch rate (several times of that of high quality thermal oxide), and therefore are referred to as low quality oxide material. The properties of these traditional low temperature isolation materials can be improved by annealing the low temperature isolation material in steam or neutral (nitrogen) ambient at temperature above 1000 degrees Celsius (° C.). However, the modified properties rapidly deteriorate with a reduced thermal budget, i.e., annealing temperature below 1000° C., and modern technologies often require lower total temperature budget (i.e., annealing temperature that are less than e.g., 800° C.). Consequently, it has proven difficult to produce high-quality isolation oxide materials (e.g., oxide materials having relatively high density and low wet etch rates) using low annealing temperatures.

Turning now to an overview of the aspects of the invention, one or more embodiments of the invention address the above-described shortcomings of the prior art by forming a protective layer at the top portion of the low temperature gap fill material that forms a high aspect ratio device element to prevent unintentional damage such as, for example, over-etching or pull-down. In one or more embodiments of the invention, the protective layer is formed by modifying or converting a portion of the low temperature gap fill material into a high-resistive material capable of withstanding various etchant chemistries employed during pre-cleaning or other downstream fabrication processes. In addition, one or more non-limiting embodiment provides a method of improving isolation material properties of oxide isolation fill materials using an anneal process that applies temperature that do not exceed an 800° C. total temperature limit. Accordingly, high aspect semiconductor device elements such as high aspect ratio STI regions, for example, can be formed free of unwanted voids and discontinuities, while the structural integrity of these high aspect device elements are maintained after performing subsequent downstream fabrication processes.

Turning now to a more detailed description of aspects of the present invention, FIG. 1 depicts a semiconductor structure 100 according to a non-limiting embodiment. The semiconductor structure includes a substrate 102, and a plurality of semiconductor fins 104 formed on the substrate 102 following one or more semiconductor fin fabrication processes. Hardmask caps 101 can also be formed on the upper surface of the semiconductor fins 104. The hardmask caps 101 can be composed of a nitride material such as silicon nitride (SiN), for example, and can serve to protect the fins 104 during subsequent fabrications processes.

The fin fabrication processes includes, for example, a photolithographic patterning process, followed by an etching process such as reactive ion etching (ME) process. The etching process transfers the photolithographic pattern into the substrate 102 and forms the semiconductor fins 104 as illustrated in FIG. 1. Although three semiconductor fins 104 are illustrated in FIG. 1, the substrate 102 can contain additional fins 104 that define a high-density arrangement of semiconductor fins 104. For example, the semiconductor fins 104 can be separated from one another by trenches 105. The distance (D) between each fin 104 can range, for example, from approximately 10 nm to approximately 50 nm to define a high-density fin pitch, or high-density arrangement of semiconductor fins 104 on the substrate 102. The high-density fin pitch defined by distance D makes it very difficult to fill the trenches 105 using a non-flowable oxide fill process.

Non-limiting examples of desirable materials for the substrate 102 include Si (silicon), strained Si, SiC (silicon carbide), Ge (germanium), SiGe (silicon germanium), SiGeC (silicon-germanium-carbon), Si alloys, Ge alloys, III-V materials (e.g., GaAs (gallium arsenide), InAs (indium arsenide), InP (indium phosphide), or aluminum arsenide (AlAs)), II-VI materials (e.g., CdSe (cadmium selenide), CdS (cadmium sulfide), CdTe (cadmium telluride), ZnO (zinc oxide), ZnSe (zinc selenide), ZnS (zinc sulfide), or ZnTe (zinc telluride)), or any combination thereof. Other non-limiting examples of semiconductor materials include III-V materials, for example, indium phosphide (InP), gallium arsenide (GaAs), aluminum arsenide (AlAs), or any combination thereof. The III-V materials can include at least one "III element," such as aluminum (Al), boron (B), gallium (Ga), indium (In), and at least one "V element," such as nitrogen (N), phosphorous (P), arsenic (As), antimony (Sb). In addition, it should be appreciated that although a bulk substrate 102 is illustrated in FIG. 1, the substrate 102 can also be formed as a semiconductor-on-insulator (SOI) substrate without departing from the scope of the invention.

Figure 2:
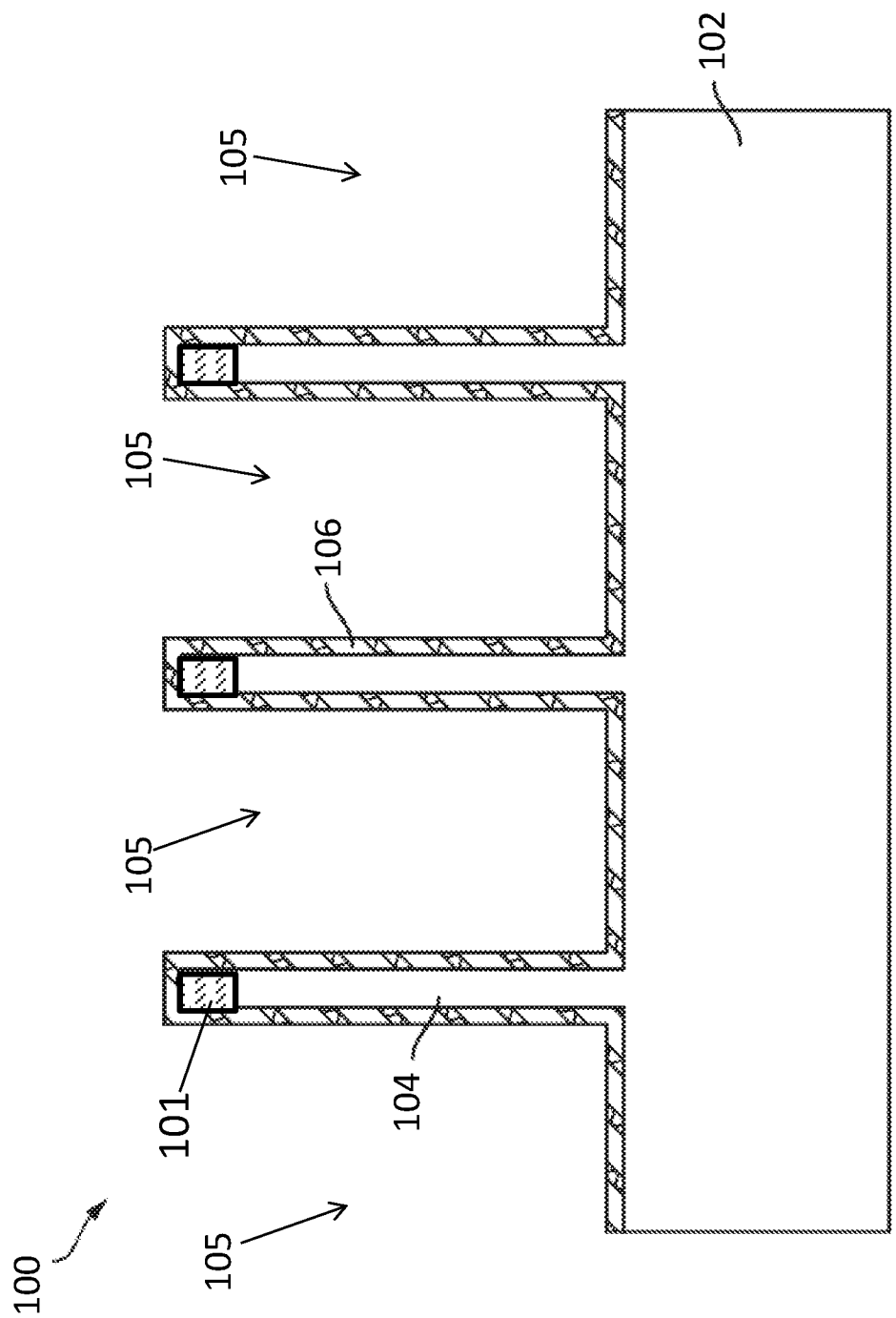
FIG. 2 illustrates the semiconductor structure following deposition of a fin protection liner according to embodiments of the invention.

Turing to FIG. 2, the semiconductor structure 100 is illustrated following deposition of a fin protection liner 106. The fin protection liner 106 is deposited on an upper surface of the substrate 102, and conforms to the sidewalls and upper surface of the semiconductor fins 104. The fin protection liner 106 can be formed using a chemical vapor deposition (CVD) process or thermally grown with or without the assistance of plasma excitation, for example, and is composed of a liner material including, but not limited to Si, silicon oxide or silicon nitride (SiN).

Figure 3:
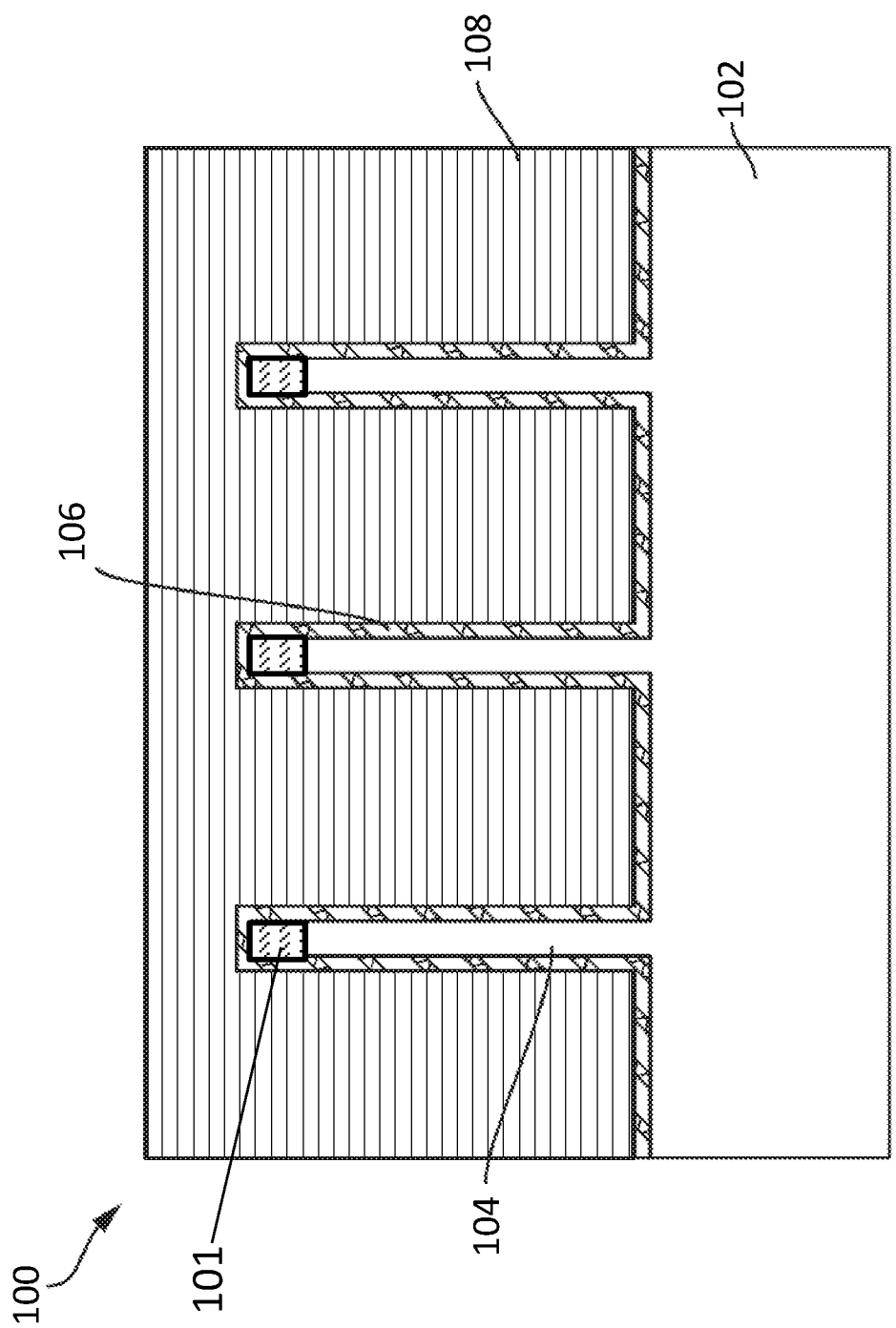
FIG. 3 illustrates the semiconductor structure after depositing a low temperature isolation material according to embodiments of the invention.

Referring to FIG. 3, the semiconductor structure 100 is illustrated after depositing a low temperature isolation material 108 on an upper surface of the fin protection liner 106 to fill the trenches 105 and cover the semiconductor fins 104. In one or more non-limiting embodiment, the low temperature isolation material 108 has a thermal budget for deposition of less than about 500 degrees Celsius (° C.). The low temperature isolation material 108 can be formed of various oxide or oxide-like materials having a dielectric constant (k) of approximately 3.9, for example, or lower. In one or more embodiments, the low temperature isolation material 108 is composed of silicon dioxide ($SiO_2$) or nominally $SiO_2$, for example, and is deposited using a flowable dielectric deposition process. It should be appreciated, however, that other deposition processes capable of depositing the low temperature isolation material 108 be used without departing from the scope of the invention.

In one or more non-limiting embodiments, the trenches 105 can be filled with other low temperature isolation materials (e.g., other than $SiO_2$) having the following electrical properties: Leakage at about 1 MV less than about $1e^{-8}$ A/cm$^2$ and less than about $1e^{-7}$ A/cm$^2$ at 2 MV; Dielectric Breakdown is greater than about 6 MV/cm; and the dielectric constant (k value) is below about 5. The material composition can include, but is not limited to, silicon (Si), carbon (C), boron (B), nitrogen (N) and Oxygen (O).

In one or more embodiments, a post-deposition heat treatment, also referred to as a post-anneal process, can be performed to increase the etch resistance (i.e., reduce the etch rate) of the modified low temperature isolation material. The post-anneal process exposes the modified low temperature isolation material to temperature above 1000° C., for example. In at least one non-limiting embodiment, a two-step post-deposition anneal process is performed. The two-step post-anneal process includes a first operation that applies heat using steam (water vapor) to anneal the modified low temperature isolation material to about 600° C., followed by a second, higher temperature anneal process up to 800° C.

Figure 4:
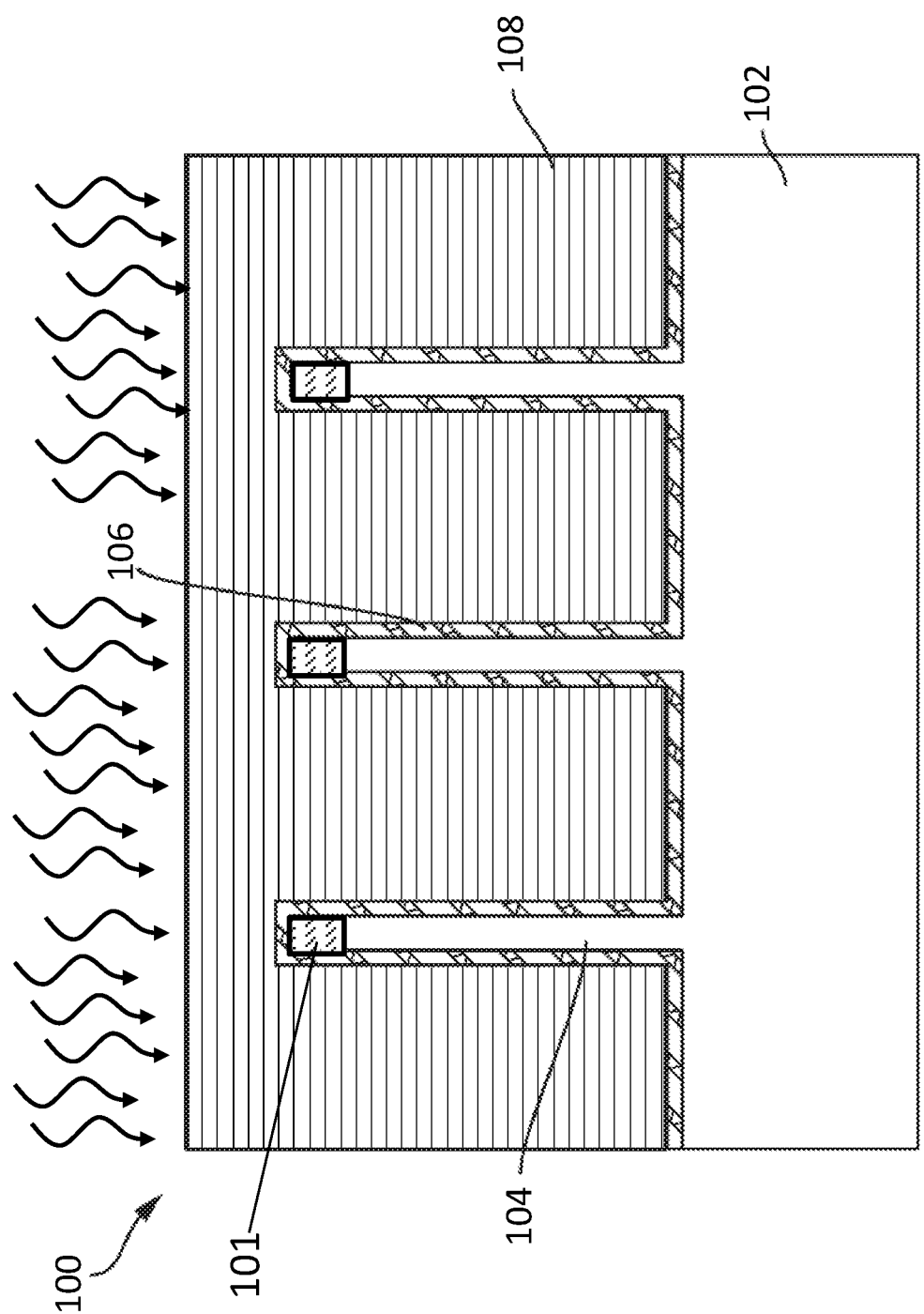
FIG. 4 illustrates the semiconductor structure undergoing a curing process according to embodiments of the invention.

Turning to FIG. 4, the semiconductor structure 100 is illustrated undergoing a curing process to cure the low temperature isolation material 108. The curing process includes, but is not limited to, a UV energy exposure process, a thermal anneal process, and a laser anneal process. A subsequent steam and/or dry nitrogen ($N_2$) anneal process can also be applied to the low temperature isolation material 108.

Figure 5:
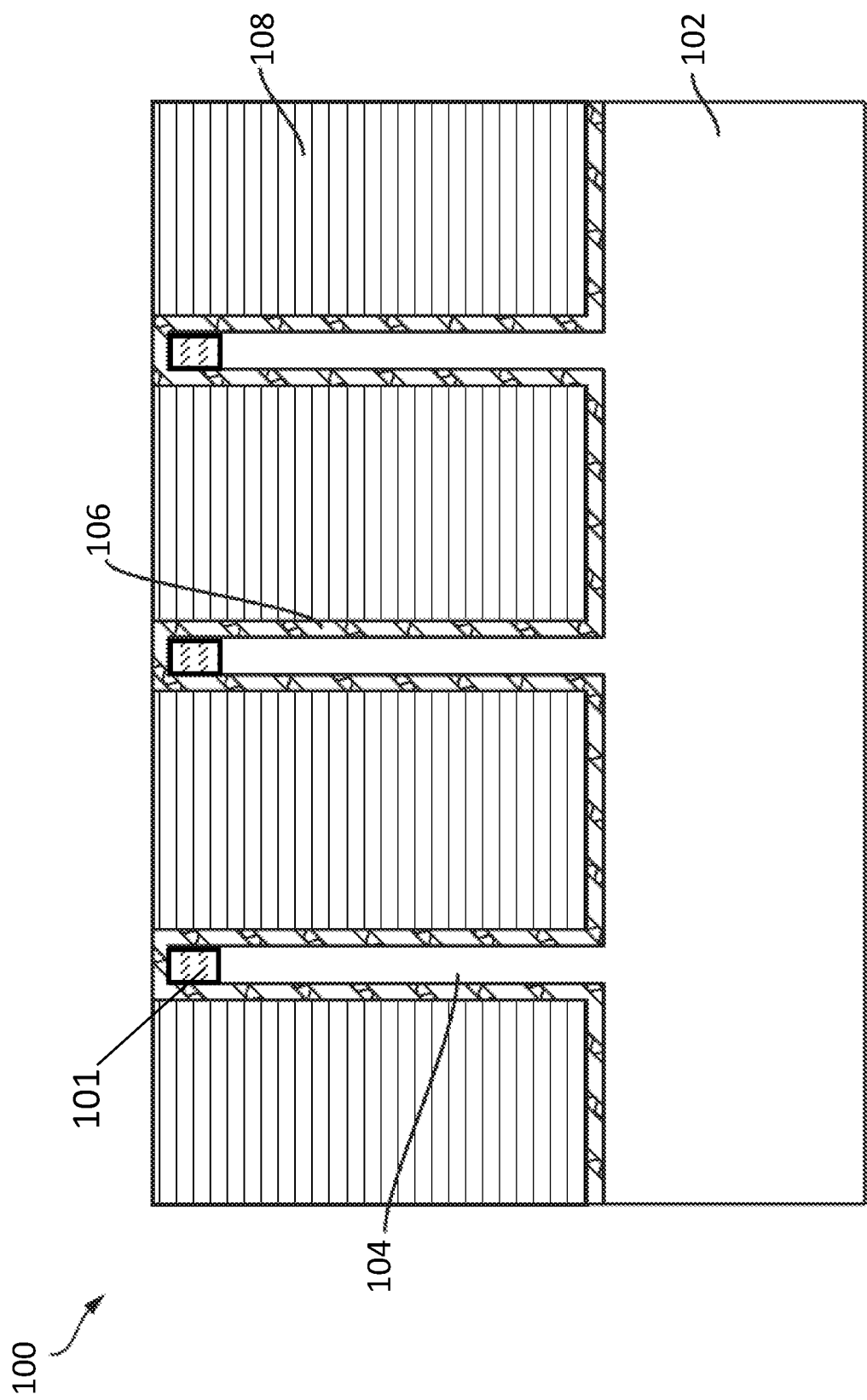
FIG. 5 illustrates the semiconductor structure following a chemical-mechanical planarization (CMP) process according to embodiments of the invention.

Turning now to FIG. 5, the semiconductor structure 100 is illustrated following a chemical-mechanical planarization (CMP) process. The CMP process can be performed to recess a portion of the low temperature isolation material 108 while stopping on the hardmask or the fin protection liner 106 formed on the upper surface of the fins 104. The CMP process can serve to remove overburden or excess low temperature isolation material 108 from the semiconductor fins 104.

Figure 6:
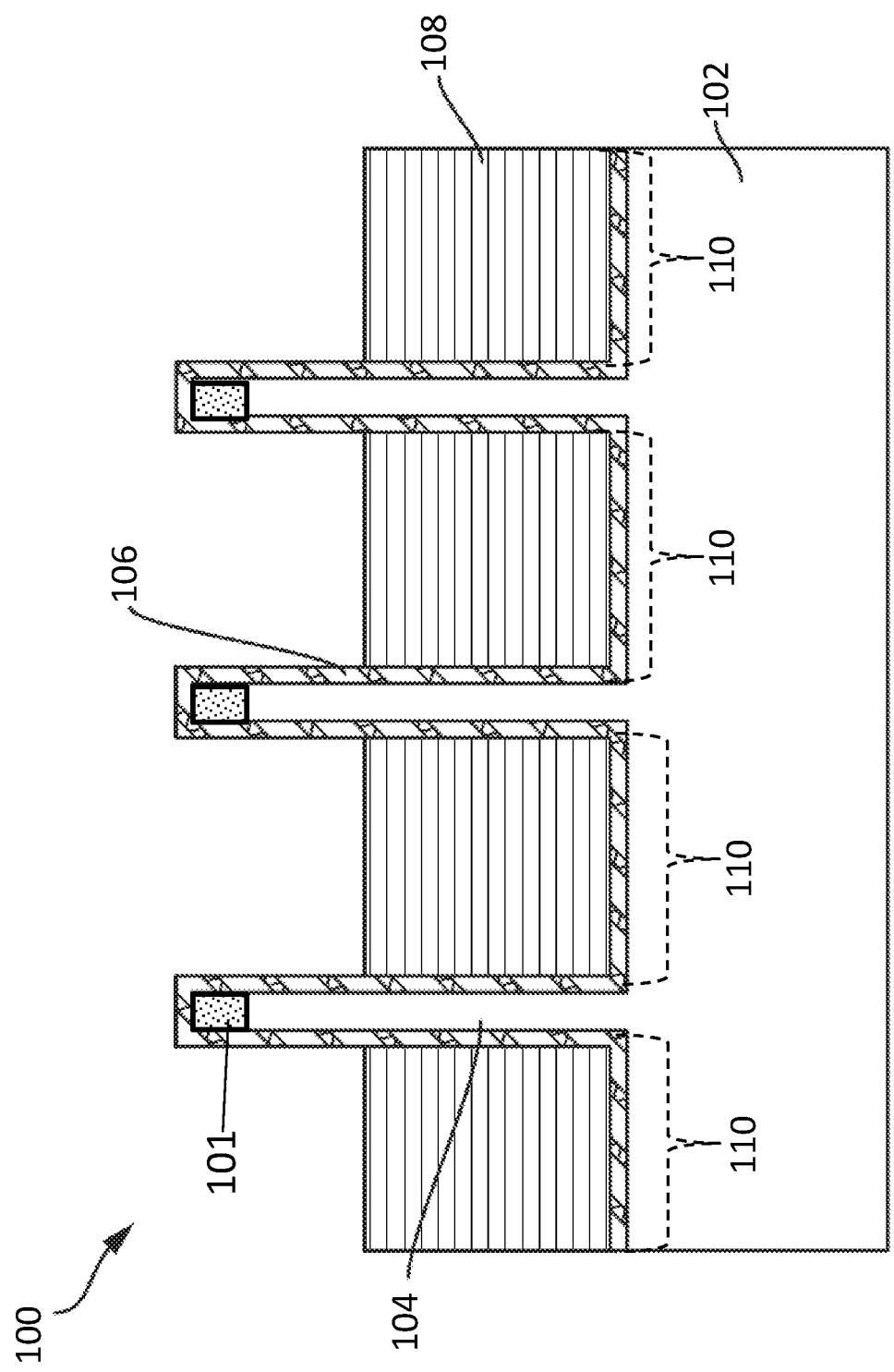
FIG. 6 illustrates the semiconductor structure after recessing the low temperature isolation material according to embodiments of the invention.

With reference now to FIG. 6, the semiconductor structure 100 is illustrated following an etching process that recesses an upper portion of the low temperature isolation material 108 to reveal a portion of semiconductor fins 104. In one or more embodiments, the isolation material 108 can be recessed using a RIE process or a wet etching process. The ME can employ a chemistry that is selective to the isolation material 108. In this manner, the low temperature isolation material 108 is recessed while the hardmask and the fin protection liner 106 are preserved as illustrated in FIG. 6. The preserved fin protection liner 106 can serve to protect the underlying semiconductor fins 104 from becoming damaged when performing one or more subsequent fabrication processes described in greater detail below. As an alternative to RIE, a wet etching process including a Hydrofluoric (HF) acid chemistry, such as diluted HF (DHF), for example, can be used.

The remaining portions of the low temperature isolation material 108 separating one or more semiconductor fins 104 can be referred to as electrical isolation regions 110 such as, for example, STI regions, and can serve to electrically isolate neighboring transistor structures that are formed during a subsequent fabrication process (not shown). In one or more embodiments, the electrical isolation regions 110 can be implemented when design applications call for neighboring gates that have opposite conductivities, e.g., nFETs and pFETs. As such, the electrical isolation regions 110 can electrically isolate an nFET device region from a pFET device region.

Figure 7:
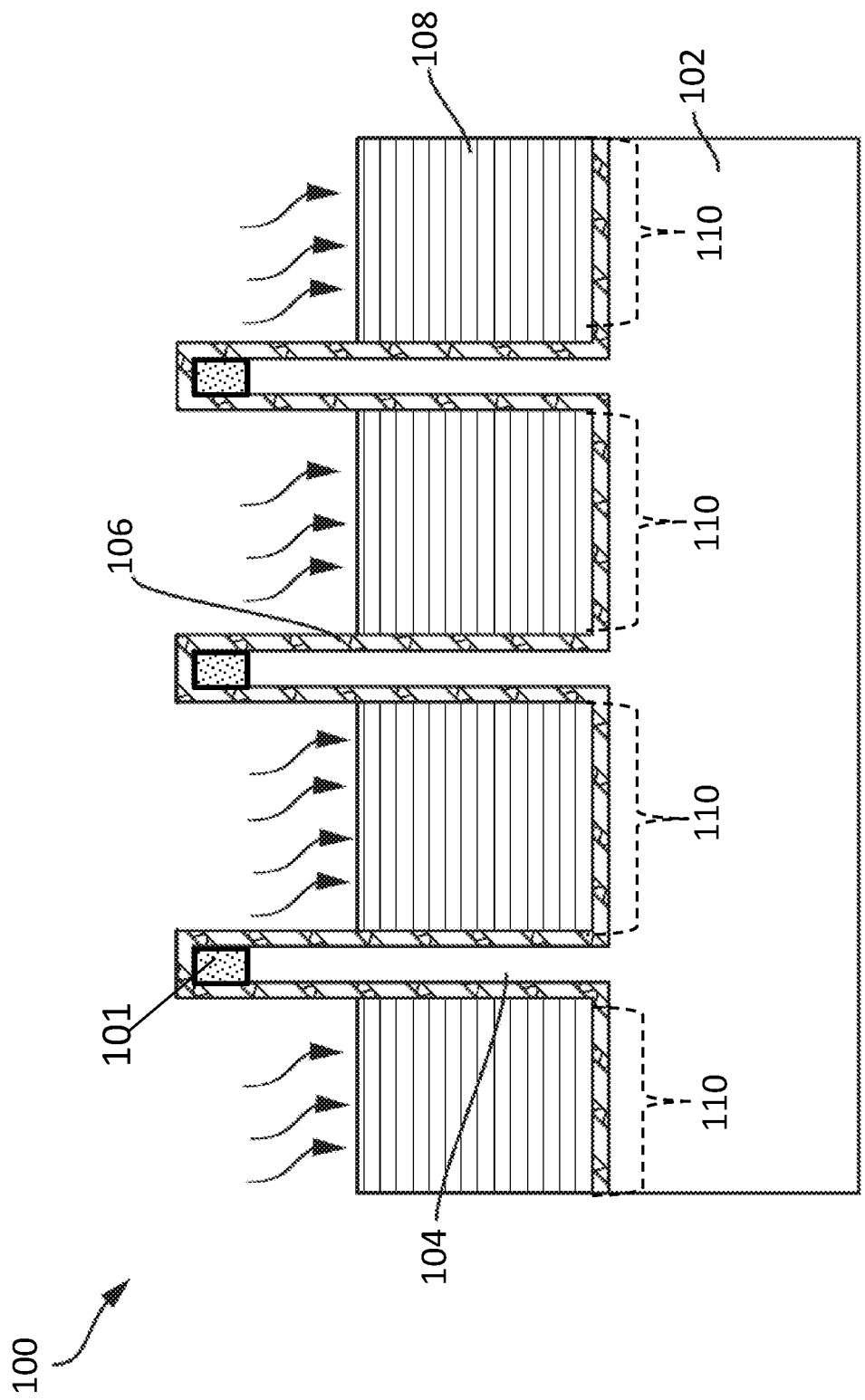
FIG. 7 illustrates the semiconductor structure undergoing a surface treatment operation according to embodiments of the invention.

Referring to FIG. 7, a surface treatment operation (indicated by the downward arrows) is applied to an upper surface of the low temperature isolation material 108. The surface treatment operation modifies or converts a portion of the low temperature isolation material 108 into a high-quality material. The high-quality material refers to the converted material's increased resistance, which allows the converted high-quality material to withstand various etchant chemistries employed during pre-cleaning or other downstream fabrication processes. Etch resistance can also be determined in terms of a material's etch rate. For instance, a material's etch rate decreases as its etch resistance increases. The etch rate of stoichiometric thermal $SiO_2$ undergoing a diluted (10:1 by volume) hydrofluoric (DHF) acid etching treatment, for example, is nominally 20 angstroms per min (20 A/min) or 2 nanometers per minute (2 nm/min). Accordingly, one or more embodiments of the invention initially deposit a low temperature isolation material 108 having an etch rate greater than about two-times (×2) that of stoichiometric thermal $SiO_2$.

In one or more embodiments, the surface treatment operation includes applying nitrogen-containing plasma (e.g., a nitrogen plasma or ammonia-based plasma) when the low temperature isolation material 108 is composed of $SiO_2$. Other plasma species, however, can be employed including, but not limited to, helium (He), hydrogen (H), argon (Ar), and oxygen (O). The fin protection liner 106 serves to protect the underlying low temperature isolation material 108.

In one or more embodiments of the invention, a high density plasma (HDP) treatment is performed to densify (i.e., increase the density) of a deposited low temperature isolation fill material. The HDP can be applied using an inductively coupled plasma (ICP) generated by an HDP reactor.

In one or more embodiments of the invention, a combination of HDP treatments can be performed. Following the HDP treatments, a post treatment anneal below 800° C. nitrogen ambient, for example, can then be performed to improve wet etch rate of the deposited insulating material significantly. In one example, the wet etch rate of the deposited insulating material was decreased from about 2 times the etch rate of thermal oxide (e.g., about 40 A per minute) to about 25 A per minute, which is closer the quality of that of thermal oxide (e.g., 20 A per minute).

In one or more embodiments of the invention, a combination of helium and oxygen ($He+O_2$) plasma treatment or a combination of hydrogen and oxygen ($H_2+O_2$) plasma treatment can be applied to the low temperature isolation material 108. The helium and hydrogen plasma flow can be delivered at above 1000 standard cubic centimeters per minute (sccms). The treatment can be applied for less than 5 minutes, for example, with a plasma power less than about 5000 watts (W). In at least one embodiment, a small amount (less than 50 sccms) of argon (Ar) can be added to the plasma to ensure stability.

In one or more embodiments of the invention, a plasma treatment including nitrogen can be applied to the low temperature isolation material 108 to change the composition of oxide and add nitrogen. The heat up step applying argon (Ar) and/or helium (He) can be applied for about 2 minutes, for example, with plasma power of about 3000 Watts, for example. After the pre-heat step, a main nitrogen plasma treatment step can be performed for a second plasma time (e.g., less than 10 min) with He as additional gas. A plasma power less than about 10 kilowatts (kW) can be used, for example, with zero or very small bias (e.g., about few hundred Watts). The process temperature can be selected depending on plasma power and can be below 500° C. for any of the HDP treatment treatments described herein.

Figure 8:
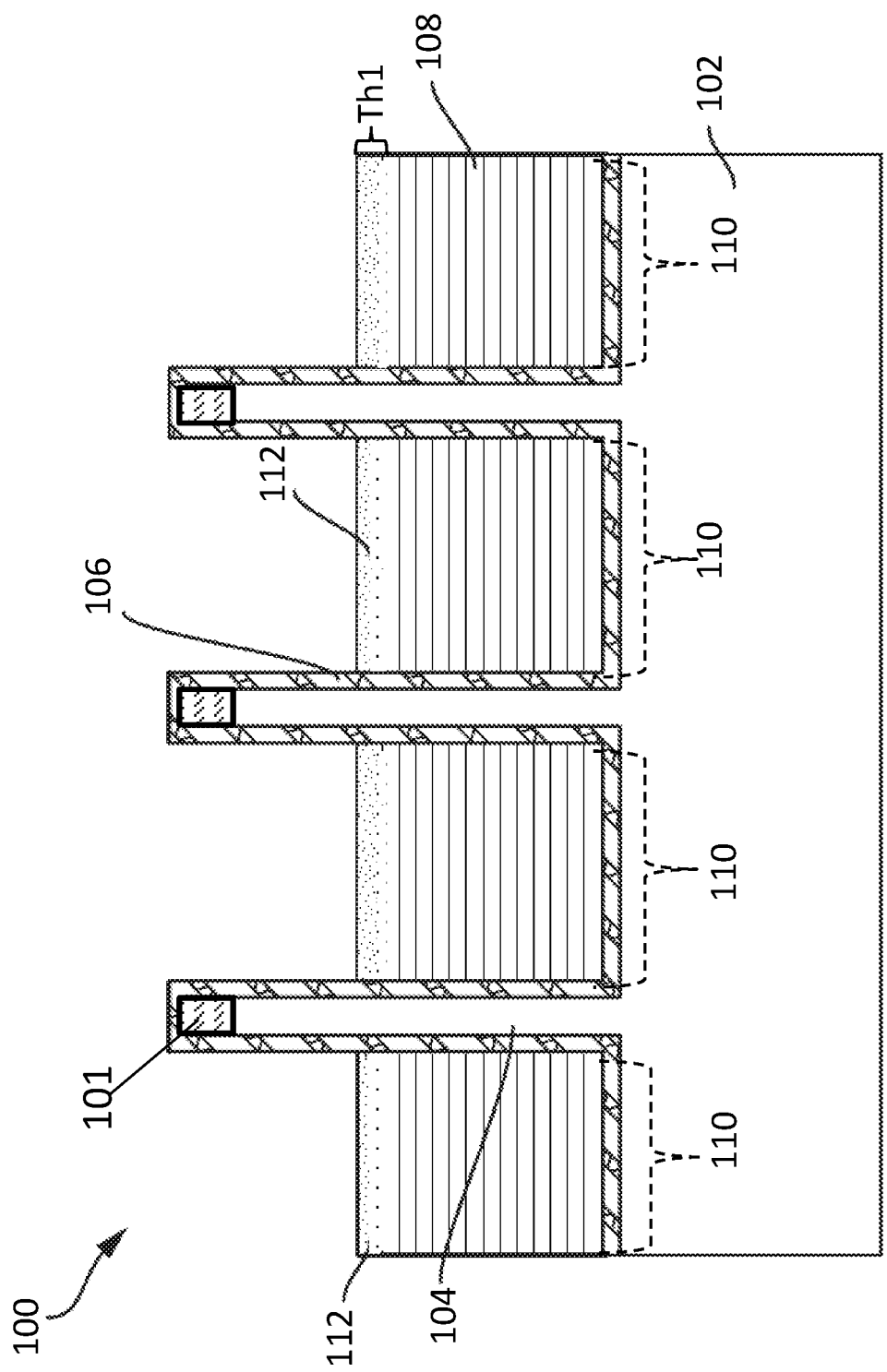
FIG. 8 illustrates the semiconductor structure following the surface treatment operation according to embodiments of the invention.

With reference now to FIG. 8, the electrical isolation regions 110 are illustrated having a protective layer 112 which results from modifying or converting a portion of the low temperature isolation material 108. The protective layer 112 is formed above the remaining non-modified low temperature isolation material 108. Accordingly, the electrical isolation regions 110 can be viewed as being modified into multi-layer electrical isolation regions 110. In other words, each multi-layer electrical isolation region 110 can be viewed as including a low temperature isolation layer 108 and a protective layer 112 formed on an upper surface of the low temperature isolation layer 108.

In the non-limiting embodiment of FIG. 8, the surface treatment operation (i.e., the plasmas treatments) modifies or converts an upper portion of the low temperature isolation dielectric material (e.g., $SiO_2$) into the protective layer 112 composed of an oxy-nitride ($SiO_xN_y$) material. The protective layer 112 resulting from the plasma treatment can have a thickness (Th1) ranging, for example, from approximately 0.5 nm to approximately 10 nm. The oxy-nitride protective layer 112 has a higher etching resistance compared to the remaining non-modified bottom layer 108. In at least one embodiment, the non-modified oxide layer 108 has an etch rate that is more than two-times (×2) greater than stoichiometric thermal $SiO_2$ when undergoing a 10:1 diluted HF (DHF) acid etching treatment, for example, while the second material of the protective layer has an etch rate that is about 1.5 times greater than stoichiometric thermal $SiO_2$ when undergoing a DHF etching treatment. Accordingly, the protective layer 112 has an etch resistance that is greater than the etch resistance of the remaining non-modified oxide layer 108.

In the case where the low temperature isolation material is composed of $SiO_2$, for example, the modified oxy-nitride protective layer 112 has a wet etch resistance that is at least twice (×2) over the etch resistance provided by $SiO_2$. Accordingly, a portion of the low temperature isolation material 108 can be modified or converted into a protective layer 112, which can then serve as a mask to protect the remaining underlying low temperature isolation material 108. Thus, no additional material deposition processes are required to form a separate high quality protective layer on top of the low temperature isolation material 108. As described herein, the term "high quality" refers to the low temperature isolation layer's 108 increased resistance to various etchant chemistries which can be employed during pre-cleaning or other downstream fabrication processes.

The elimination of a separate deposition process also improves the precision at which the electrical isolation regions 110 are formed. For example, the height of the electrical isolation regions 110 is not subsequently increased because the underlying low temperature isolation material 108 can be protected without depositing additional materials. Also, the multi-layer electrical isolation region 110 can also be formed free of physical interfaces or contact surfaces between the low temperature isolation material 108 and the protective layer 112 because the protective layer 112 is converted directly from the low temperature isolation material 108 and therefore can be integrated therewith.

Figure 9:
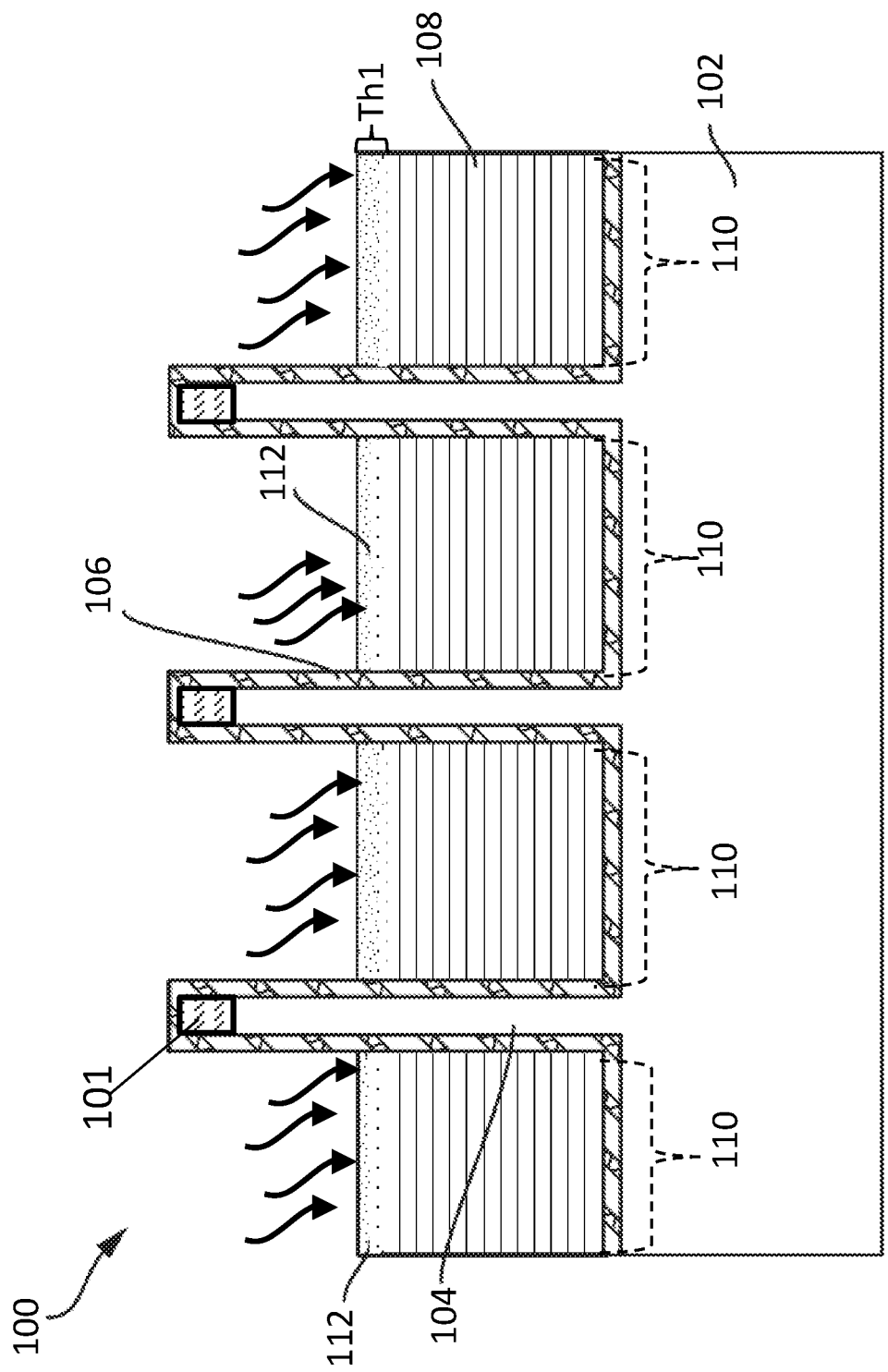
FIG. 9 illustrates the semiconductor structure undergoing an optional subsequent nitrogen plasma treatment.

In one or more embodiments of the invention, the plasma treatment including nitrogen can be utilized as an optional subsequent plasma treatment that is performed after an initial plasma treatment (e.g., the helium and oxygen (He+$O_2$) combination plasma treatment or after performing an initial hydrogen and oxygen (H+$O_2$) combination plasma treatment). Accordingly, nitrogen elements are introduced into the initially modified portion of the protective layer 112 (see FIG. 9).

Figure 10:
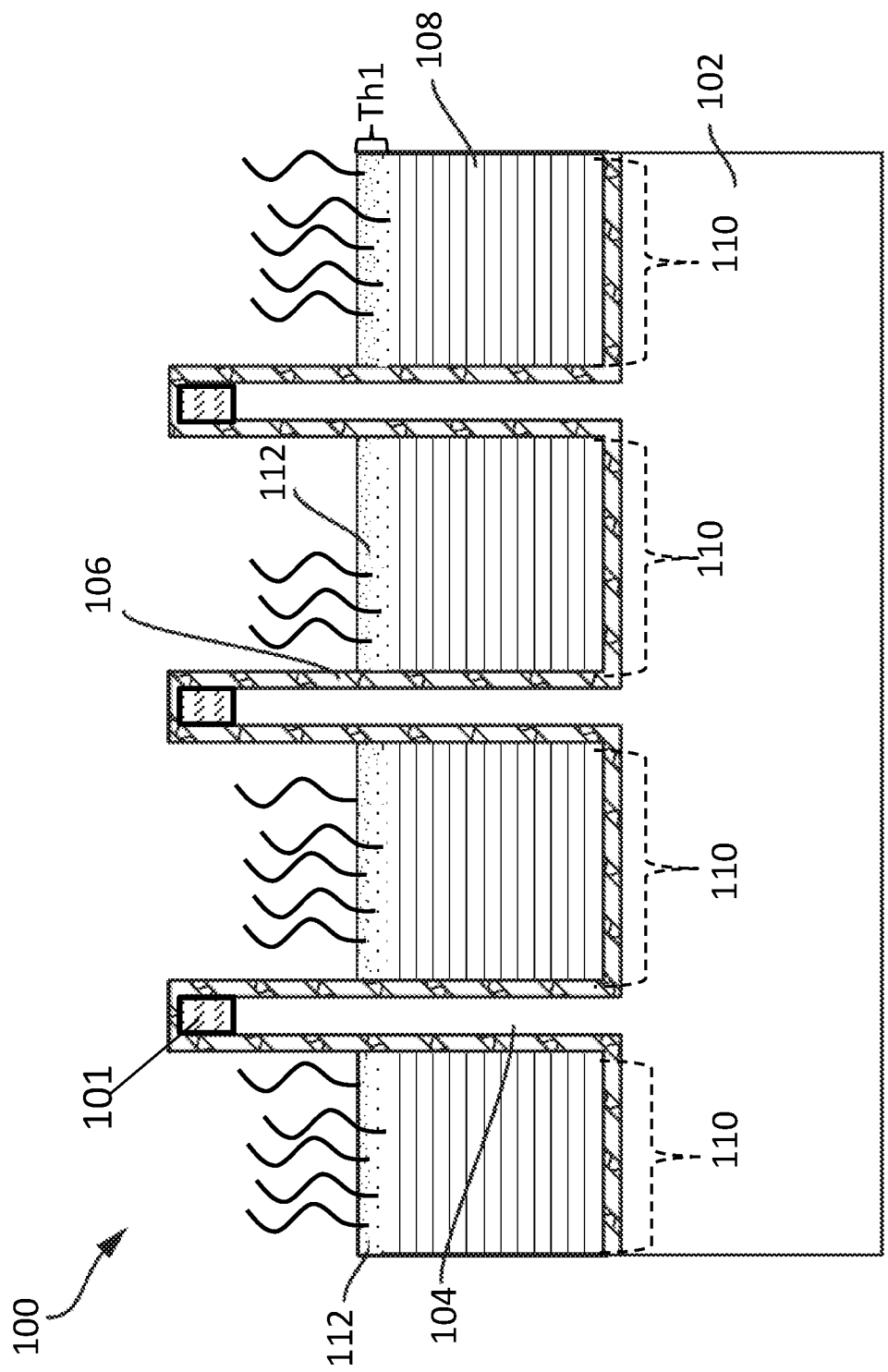
FIG. 10 illustrates the semiconductor structure undergoing the densification anneal of low temperature isolation material.

Turning to FIG. 10, the semiconductor device 100 is illustrated undergoing a thermal anneal process after forming the protective layer 112. The thermal anneal process anneals the converted oxide material of the protective layer 112 at temperatures below approximately 900° C. so as to increase the density of the protective layer 112. In at least one embodiment, the protective layer 112 reaches a temperature ranging from about 500° C. to about 800° C. In this manner, etch resistance of the protective material 112 is increased thereby further reducing the material's etch rate. Alternatively the anneal process can be performed at an earlier step. For example, the anneal process can be performed prior to revealing the fins 104 (see FIG. 5).

Figure 11:
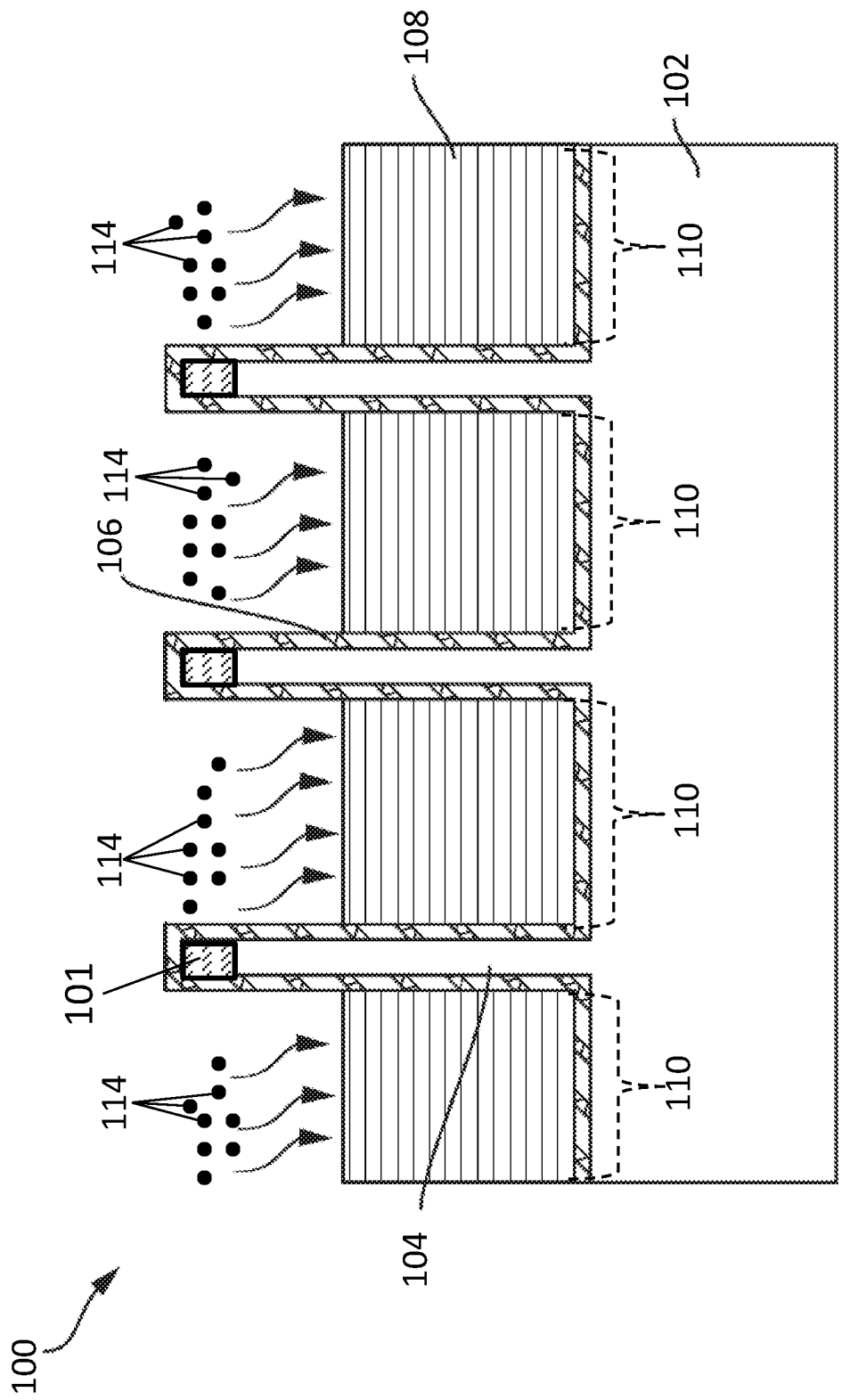
FIG. 11 illustrates the semiconductor structure undergoing an ion implantation operation according to embodiments of the invention.

Turning now to FIG. 11, the semiconductor device 100 is illustrated undergoing an ion implantation operation (indicated by the downward arrows) to form multi-layer electrical isolation regions 110 according to another non-limiting embodiment. In this embodiment, ions 114 (indicated by the downward arrows) are implanted into the low temperature isolation material 108, while the hardmask and fin protection liner 106 serve to protect the underlying fins 104.

Unlike plasma treatments, the ions delivered during the ion implant process can penetrate deep into the low temperature isolation material 108, thereby forming a deep protective layer with improved properties. The deep penetration of the ions also allows for modifying the full thickness of the low temperature isolation material 108. The ions 114 can include various types or chemical species including, but not limited to, nitrogen (N), helium (He), hydrogen (H), and argon (Ar) or silicon (Si). Unlike a traditional plasma treatment, the energy of the ion implantation process can be varied to control the depth at which the ions 114 are implanted into the low temperature isolation material 108.

When the fins 104 are formed from Si, for example, an ion implantation process that implants silicon (Si) ions can be performed to avoid contaminating the Si fins 104 with a counteracting material. In this example, the Si ions form a silicon-rich insulating material, which has a wet etch rate that is lower than traditional thermal oxide materials. In one or more embodiments of the invention, silicon implant energies can range, for example, from about 2 kilo-electron-volts (keV) to about 35 keV, and doses can range, for example, from $e^{13}$ to $e^{15}$ at/cm2.

Figure 12:
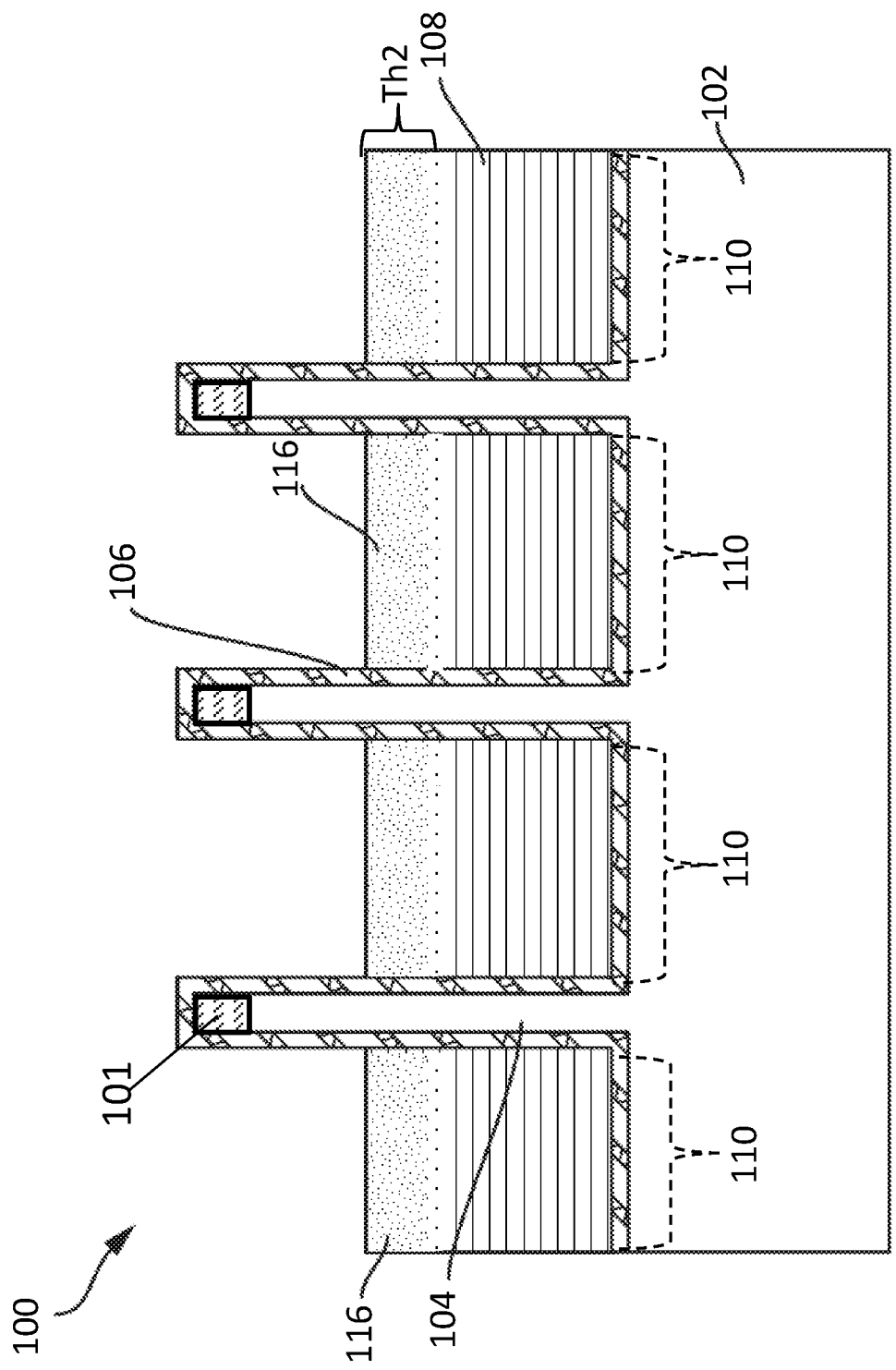
FIG. 12 illustrates the semiconductor structure following the ion implantation operation according to embodiments of the invention.

Referring to FIG. 12, multi-layer electrical isolation regions 110 are illustrated following the aforementioned ion implantation process. The multi-layer electrical isolation regions 110 each include a protective layer 116 formed above a non-modified portion of the low temperature isolation material 108. In the non-limiting embodiment of FIG. 10, the implanted nitrogen ions modify or convert a portion of the low temperature isolation material (e.g., $SiO_2$) into the protective layer 116 composed of an oxy-nitride (SiOxNy) material. The oxy-nitride protective layer 116 has a higher etching resistance compared to the remaining non-modified low temperature isolation material 108. In addition, the modified oxy-nitride protective layer 116 has a greater density than the remaining underlying low temperature isolation material 108.

As described above, the modified oxy-nitride protective layer 116 has a wet etch resistance that is least twice (×2) over the etch resistance provided by the $SiO_2$ non-modified low temperature isolation material 108. Accordingly, a portion of the low temperature isolation material 108 can be modified into a protective layer 116, which can then serve as a mask to protect the remaining underlying low temperature isolation material 108. Thus, no additional material deposition processes are required to form a separate layer on top of the low temperature isolation material 108. The elimination of a separate deposition process also improves the precision at which the electrical isolation regions 110 are formed. For example, the height of the electrical isolation regions 110 is not subsequently increased because the underlying low temperature isolation material 108 can be protected without depositing additional materials. Also, the multi-layer electrical isolation region 110 can also be formed free of physical interfaces between the low temperature isolation material 108 and the protective layer 116 because the protective layer 116 is converted directly from the low temperature isolation material 108 and therefore is integrated therewith.

As described above, the energy level used to implant the ions 114 can be varied to control a thickness (Th2) of the protective layer 116. Accordingly, the protective layer 116 can be formed at greater depths in the electrical isolation regions 110 compared to the protection layer 112 formed using the plasma treatment operation described above. For example, the protective layer 116 resulting from the ion implantation process can have a thickness (Th2) ranging from approximately 0.5 nm to approximately 100 nm. In other non-limiting embodiments, the entire low temperature isolation material 108 can be modified such that the protective layer 116 reaches the base of the electrical isolation regions 110 located near the substrate 102. In another example, the thickness (Th2) of the protective layer 116 can be greater than a thickness of the non-modified temperature isolation material 108.

In addition, the ion implantation technique can be used to implant different types of ions or different chemical species at different depths within the electrical isolation regions 110. In this manner, a multi-layer electrical isolation region 110 can be formed having several different protective layers, with each protective layer composed of a different material or different chemical species.

Figure 13:
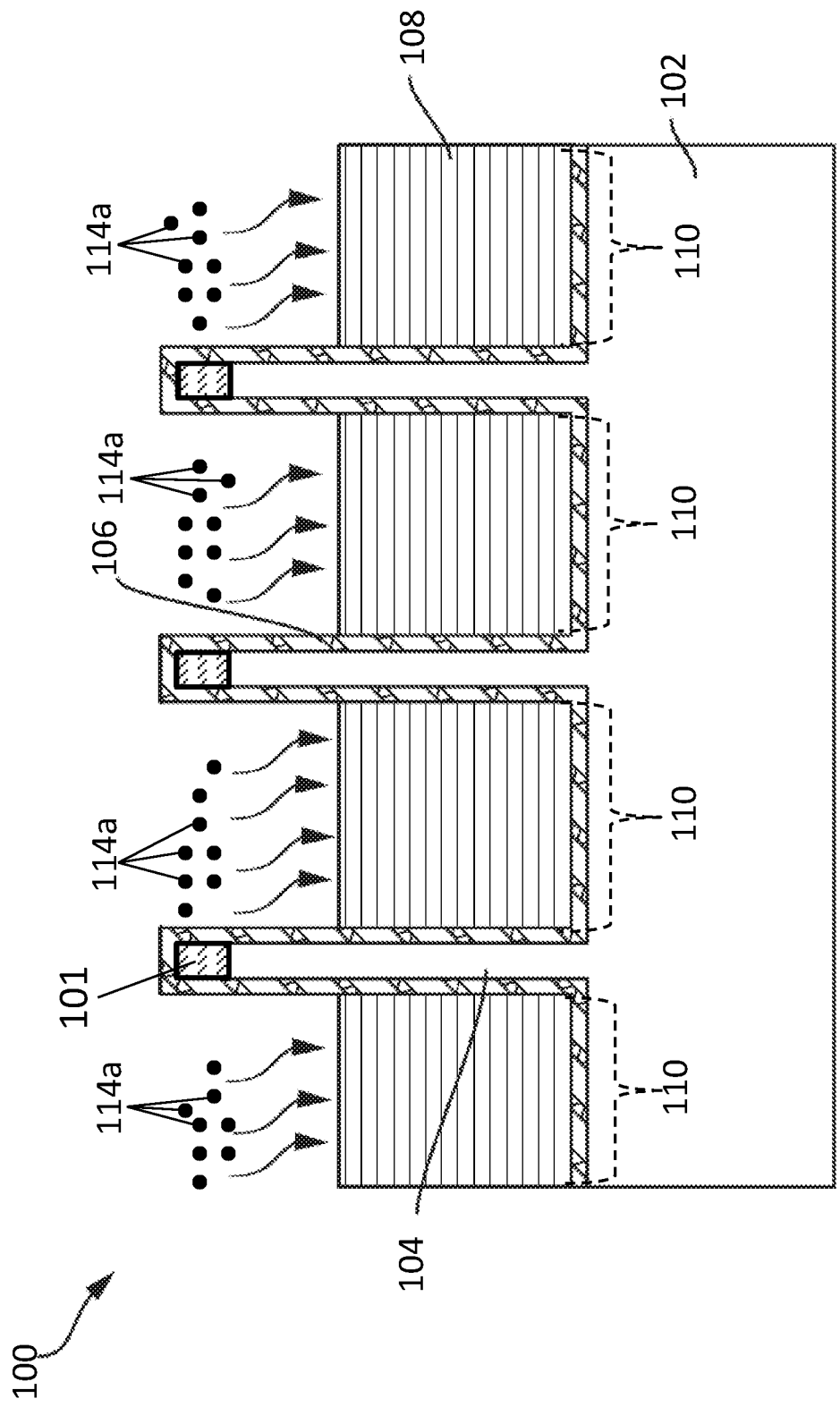
FIG. 13 illustrates the semiconductor structure undergoing a first ion implantation operation according to embodiments of the invention.

Referring to FIG. 13, for example, a first ion implantation process is performed. The first ion implantation process includes implanting a first ion type 114a or chemical species 114a into the low temperature isolation material 108 (e.g., $SiO_2$) located in the electrical isolation regions 110. The first type of ions 114a can include, but are not limited to silicon (Si). In addition, the first ion implantation process implants the first ions 114a according to a first energy level so that the depth (e.g., distance extending from the upper surface into the low temperature isolation material 108) of the resulting first protective layer (not shown in FIG. 11) can be controlled.

Figure 14:
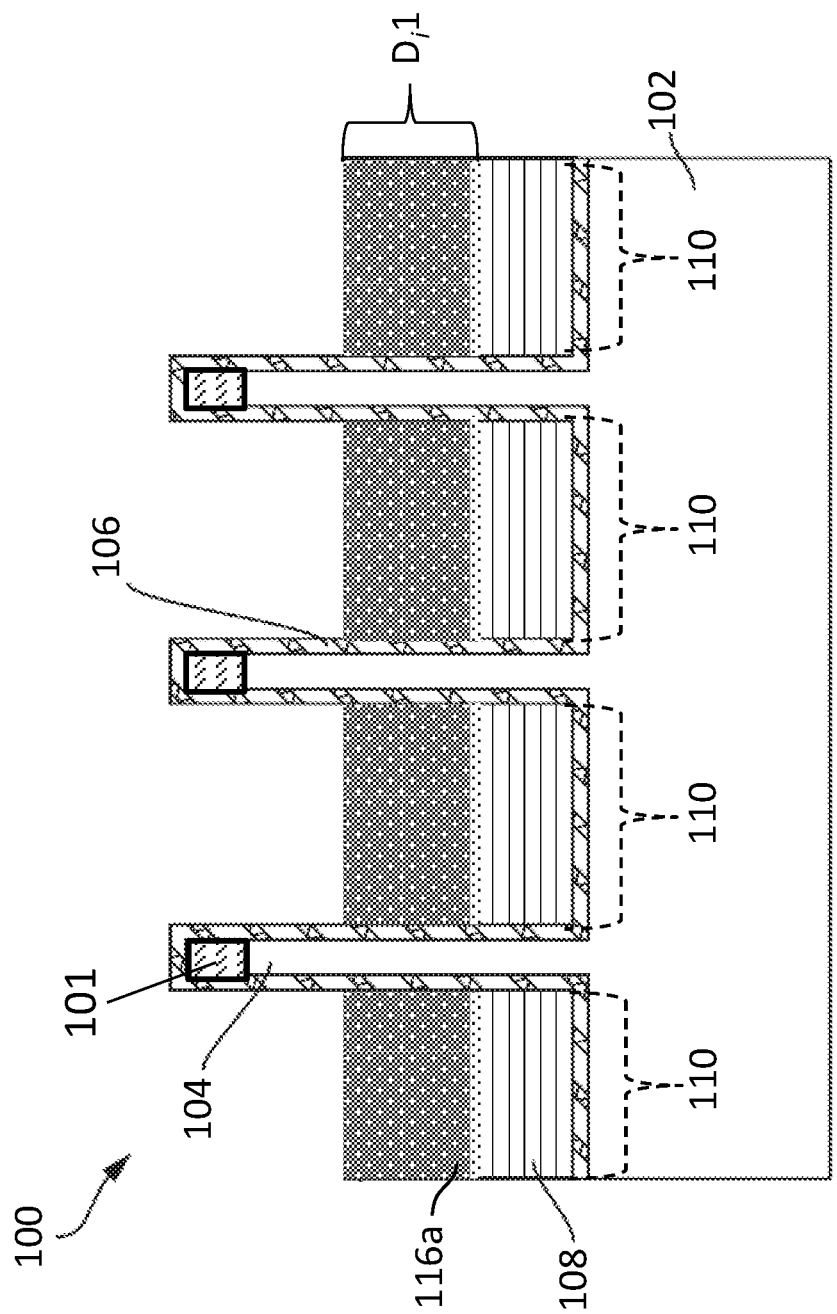
FIG. 14 illustrates the semiconductor structure following the first ion implantation process according to embodiments of the invention.

Turning to FIG. 14, the semiconductor device 100 is illustrated having a first protective layer 116a formed according to the first ion implantation process. Referring to the example described in FIG. 11, implantation of Si ions 114a into the low temperature isolation material 108 composed of $SiO_2$ forms a silicon-rich ($Si_xO_y$) protective layer 116a. The Si-rich protect layer 116a can be viewed as having higher levels of Si than the non-modified $SiO_2$ low temperature isolation material 108. In addition, the Si-rich protective layer 116a can have increased thermal and/or etch resistance compared to the non-modified $SiO_2$ low temperature isolation material 108. The first protective layer 116a also reaches a first depth determined by the energy level used to implant the first ions 114a to define a first thickness ($D_i1$).

Figure 15:
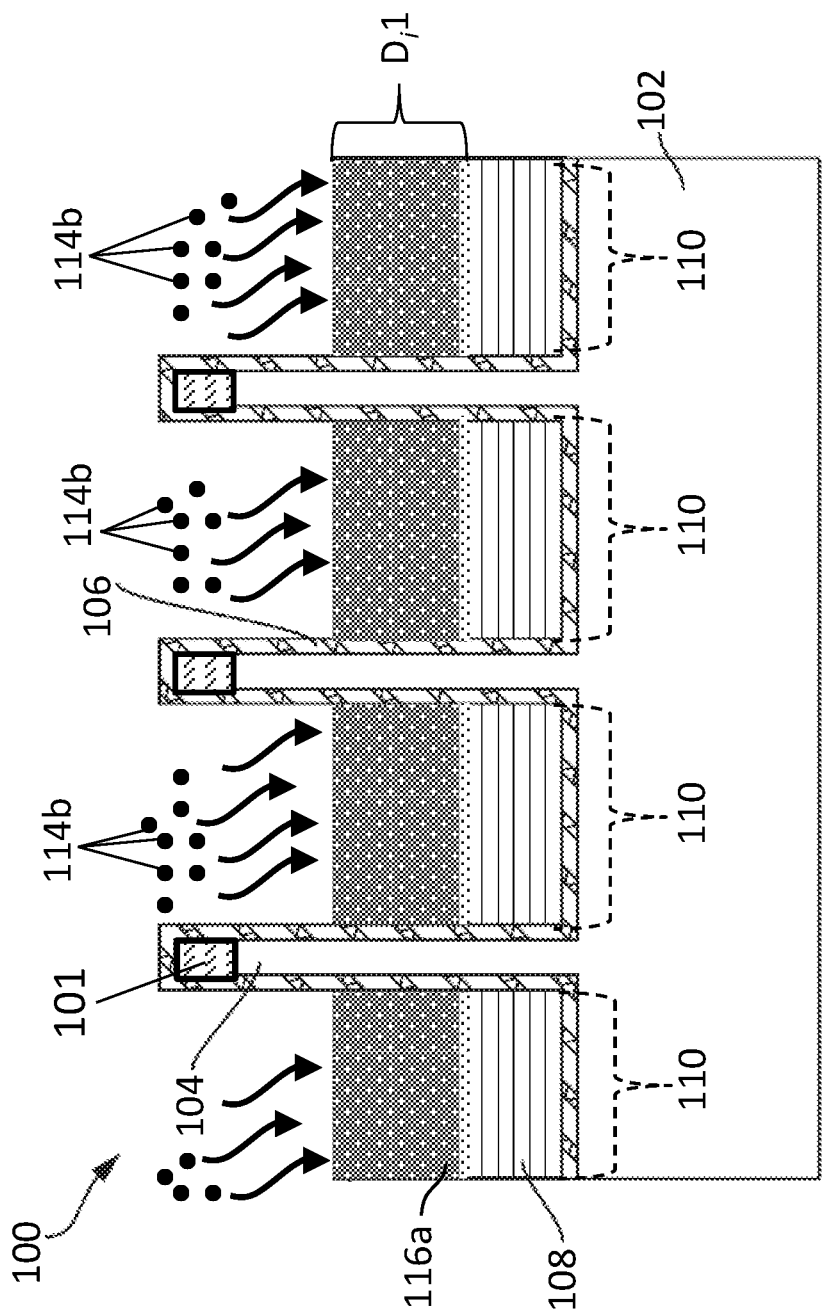
FIG. 15 illustrates the semiconductor structure undergoing a second ion implantation process according to embodiments of the invention.

Referring now to FIG. 15, a second ion implantation process is performed. The second ion implantation process includes implanting a second type of ions 114b or chemical species into the first protective layer 116a located in the electrical isolation regions 110. The second type of ions 114b can include, but are not limited to, nitrogen (N), helium (He), hydrogen (H), and argon (Ar). The energy level of the second ion implantation process can be adjusted (e.g., reduced) such that the second ions 114b can be implanted at a selected depth in relation to the first protective layer 116a.

Figure 16:
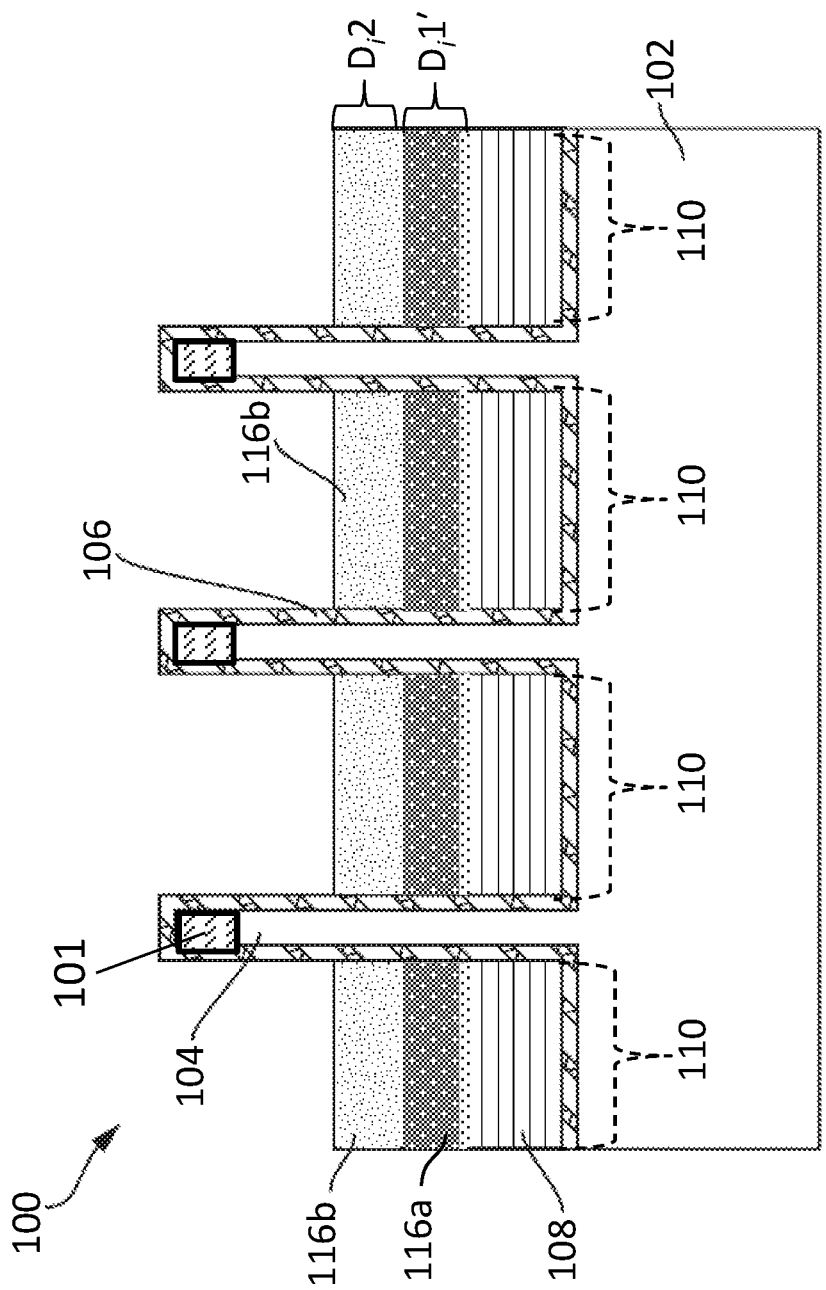
FIG. 16 illustrates the semiconductor structure following the second ion implantation process according to embodiments of the invention.

Turning now to FIG. 16, the semiconductor device 100 is illustrated having a second protective layer 116b formed according to the second ion implantation process. The second protective layer 116b is composed of a different material with respect to the first protective layer 116a. For example, implantation of N ions into the Si-rich ($Si_xO_y$) protective layer 116a forms an oxy-nitride ($Si_xO_yN_z$) protective layer 116b. The second protective layer 116b also reaches a second depth determined by the energy level used to implant the second ions 114b. In the example illustrated in FIGS. 13 and 14, the second depth of the second protective layer 116b is less than the first depth of the first protective layer 116a. Accordingly, the second protective layer 116b is formed having a second thickness ($Di2$). Because a portion of the first protective layer 116a is converted into the second protective layer 116b, the original thickness ($Di1$) of the first protective layer 116a can be viewed as being reduced ($Di1'$) following the second ion implantation process.

In another embodiment, a plasma treatment operation can be applied to the upper surface of the Si-rich ($Si_xO_y$) protective layer 116a. In this manner, an upper portion of the Si-rich ($Si_xO_y$) protective layer 116a is converted into a second protective layer 116b. For example, an upper portion of the Si-rich ($Si_xO_y$) protective layer 116a can be converted to an oxy-nitride ($Si_xO_yN_z$) protective layer 116b when plasma containing a nitrogen species is applied thereto.

In either scenario described above, the oxy-nitride ($Si_xO_yN_z$) protective layer 116b resulting from the nitridation of oxide provides greater etching resistance compared to the Si-rich oxide ($Si_xO_y$) protective layer 116a and the original low temperature dielectric material (e.g., $SiO_2$). Accordingly, a multi-layer electrical isolation region 110 can be formed having several different protective layers 116a and 116b. Each protective layer 116a and 116b can be composed of a different material, e.g., $Si_xO_y$ and $Si_xO_yN_z$, respectively, and therefore can provide different wet etch resistance characteristics at selected layers or levels of the multi-layer electrical isolation region 110. Although the first and second protective layers 116a and 116b are illustrated as distinct individual layers, it should be appreciated that the ions 114a and 114b corresponding to the respective protective layer can be deposited to form a gradient composition of chemical species extending from the low temperature isolation material layer 108 to the upper surface of the second protective layer 116b.

Figure 17:
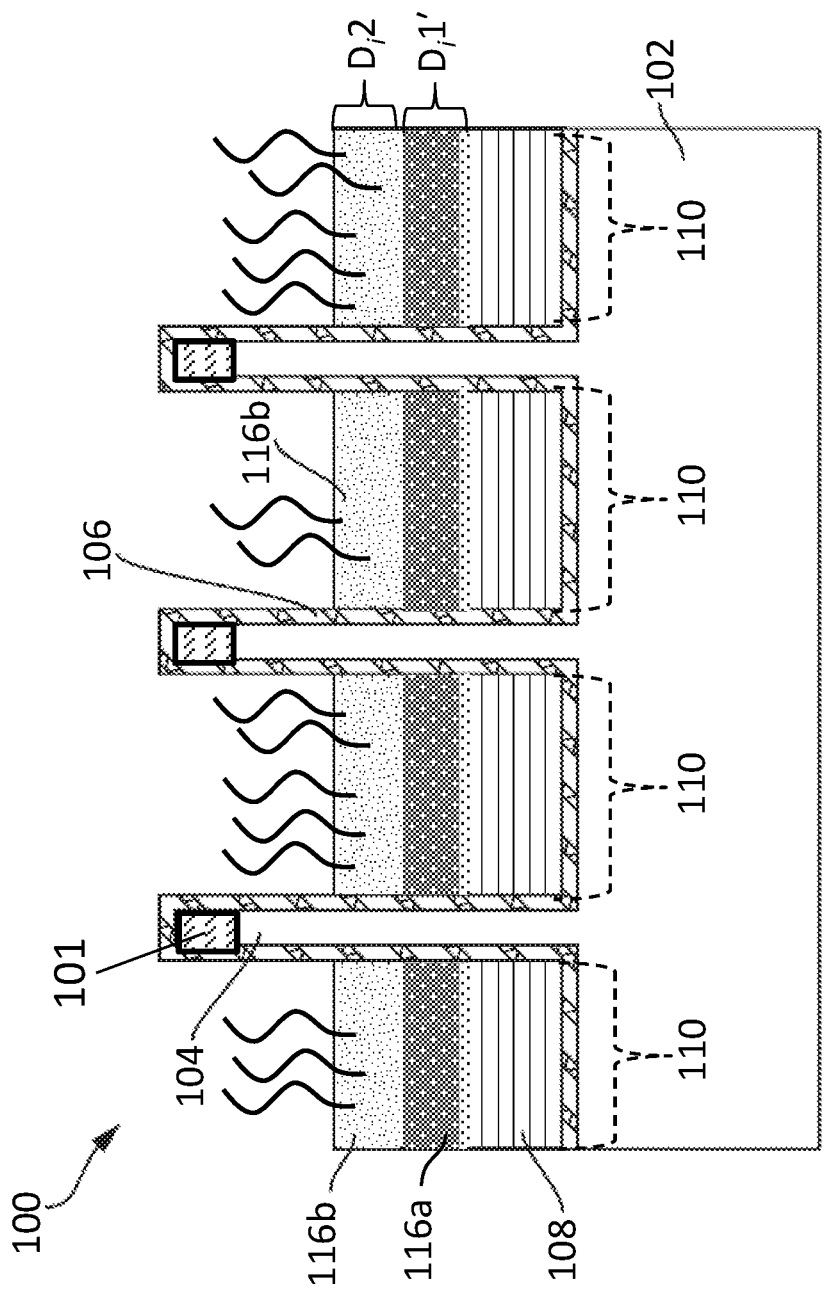
FIG. 17 illustrates the semiconductor structure of FIG. 16 undergoing the densification anneal of low temperature isolation material following the second ion implantation process.

Turning to FIG. 17, the semiconductor device 100 is illustrated undergoing a densification anneal of the first and second protective layers 116a and 116b. The densification anneal includes applying heated steam to the low temperature isolation material 108. in at least one embodiment, the low temperature isolation material 108 is heated to a temperature ranging from about 500° C. to about 800° C. Accordingly, the density of the first and second protective layers 116a and/or 116b layers is increased such that the etch rate of the first and second protective layers 116a and 116b is decreased.

Although embodiments described above initially perform a deep implantation process to form the first protective layer 116a prior to forming the second modified layer 116b, the invention is not limited thereto. For instance, a surface treatment (e.g., plasma treatment) can be performed first to convert a first portion of the low temperature isolation material layer 108 into oxy-nitride ($SiO_xN_y$) protective surface layer. Thereafter, a subsequent ion implantation process can be performed to form an underlying second portion of the low temperature isolation material layer 108 (i.e., located beneath the converted $SiO_xN_y$ protective surface layer) into a Si-rich oxide ($Si_xO_y$) protective layer.

Figure 18:
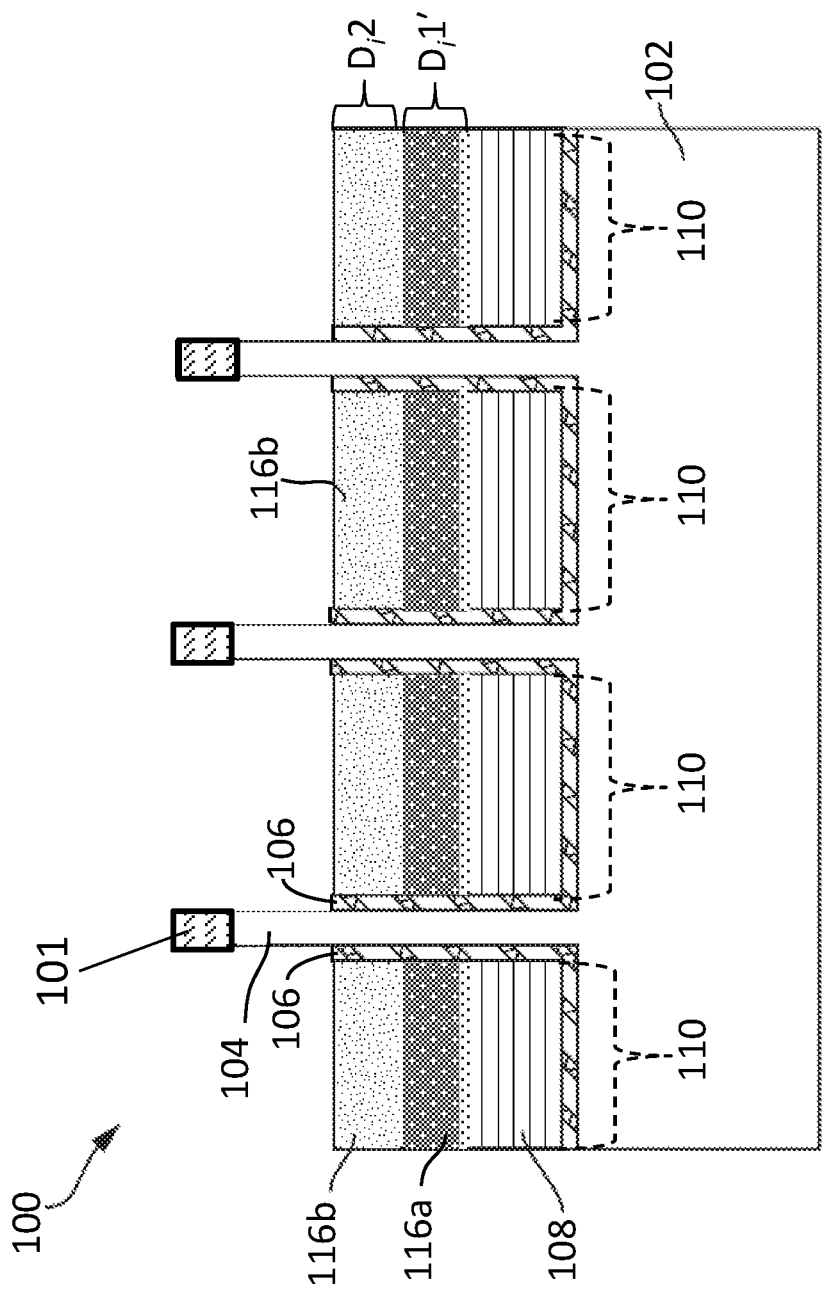
FIG. 18 illustrates the semiconductor structure after removing the fin protection liner from exposed upper portions of the semiconductor fins according to embodiments of the invention.

Turning to FIG. 18, the semiconductor device 100 is illustrated following removal of the fin protection liner 106 from exposed portions of the semiconductor fins 104 located above the upper surface of the multi-layer electrical isolation region 110. The etching process can use various etching chemistries selective to the material of the fin protection liner 106. For example, a heated phosphoric acid etchant can be applied to the semiconductor fins 104 to remove a fin protection liner 106 composed of silicon nitride (SiN) while preserving the underlying semiconductor fins 104 and second protective layer 116b. A RIE process that utilizes chemistries selective to the selected material of the fin protection liner 106 can also be employed. Although the hardmask caps 101 are shown as being maintained following partial removal of the fin protection liner 106, it should be appreciated that the hardmask caps 101 can also be removed from the upper surfaces of the fins 104 at this stage.

Although removal of the fin protection liner 106 is described after performing the two different ion implantation processes described above, the stage at which the fin protection liner 106 can be removed is not limited thereto. For example, the fin protection liner 106 can be removed after performing the plasma technique used to form protective layer 112 (see e.g., FIG. 9). In another example, the fin protection liner 106 can be removed after performing the single ion implantation process used to form the single protective layer 116 (see e.g., FIG. 12).

As described herein, one or more embodiments of the invention modify or convert a portion of a low temperature isolation fill material used to form a high aspect ratio device element (e.g., a high aspect ratio STI region) into a high-resistive protective layer capable of withstanding various etchant chemistries employed during pre-cleaning or other downstream fabrication processes. Accordingly, a resulting high aspect ratio semiconductor device element can be formed from a low temperature isolation material while being protected from downstream cleaning processes and other subsequent fabrication operations. In some examples, high aspect trenches can be filled using a low temperature isolation material to form high aspect STI regions. Accordingly, these resulting STI regions can be formed without voids or other deficiencies commonly present when using non-flowable oxide fill processes, but are protected from unintentional over-etching and pull-down due to the modified protective layer.

The descriptions of the various embodiments of the present invention have been presented for purposes of illustration, but are not intended to be exhaustive or limited to the embodiments describe. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A method of fabricating a semiconductor structure, the method comprising:
    forming a plurality of semiconductor fins on an upper surface of a semiconductor substrate, the semiconductor fins spaced apart from one another by a respective trench to define a fin pitch;
    depositing a fin protection liner that conforms to outer surfaces of the semiconductor fins and the upper surface of the semiconductor substrate;
    depositing a gap filling isolation material in the trenches such that the fin protection liner is interposed between the gap filling isolation material and each fin among the plurality of semiconductor fins, the isolation material having a first etch resistance;
    converting a portion of the isolation material into a different second isolation material that defines a protective layer having a second etch resistance that is greater than the first etch resistance; and
    annealing the converted second isolation material to further increase the second etch resistance, wherein the annealing includes exposing the converted second isolation material to an annealing temperature that is below 900 degrees Celsius.

2. The method of claim 1, wherein converting a portion of the isolation material comprises treating an upper surface of the oxide material with high-density plasma (HDP) containing a chemical element, wherein the isolation material comprises nominally stoichiometric silicon dioxide ($SiO_2$), and wherein the chemical element includes an element selected from a group comprising nitrogen (N), helium (He), hydrogen (H), and argon (Ar) and oxygen (O).

3. The method of claim 2, wherein converting a portion of the isolation material comprises performing a surface treatment process that applies a high-density plasma (HDP) containing combination of helium (He) and oxygen ($O_2$) to an upper surface of the isolation material.

4. The method of claim 3, further comprising performing a second surface treatment process that applies a high-density plasma (HDP) containing nitrogen (N) to the upper surface previously treated with the combination of helium (He) and oxygen ($O_2$).

5. The method of claim 2, wherein converting a portion of the isolation material comprises performing a surface treatment process that applies a high-density plasma (HDP) containing combination of hydrogen ($H_2$) and oxygen ($O_2$) to an upper surface of the isolation material.

6. The method of claim 5, further comprising performing a second surface treatment process that applies a high-density plasma (HDP) containing nitrogen (N) to the upper surface previously treated with the combination of hydrogen (H) and oxygen ($O_2$).

7. A method of fabricating a semiconductor structure, comprising:
   forming a plurality of semiconductor fins on an upper surface of a semiconductor substrate, the semiconductor fins spaced apart from one another by a respective trench to define a fin pitch;
   depositing a fin protection liner that conforms to outer surfaces of the semiconductor fins and the upper surface of the semiconductor substrate;
   depositing a gap filling oxide material in the trenches such that the fin protection liner is interposed between the gap filling oxide material and each fin among the plurality of semiconductor fins, the oxide material having a first material etch rate; and
   implanting silicon ions into the oxide material to convert a portion of the oxide material into a different second material that defines a protective layer having a second material etch rate that is lower than the first material etch rate.

8. The method of claim 7, further comprising annealing the protective layer to further reduce the second material etch rate.

9. The method of claim 8, wherein an annealing temperature applied to the protective layer is below 900 degrees Celsius.

10. The method of claim 9, wherein the oxide material comprises nominally stoichiometric silicon dioxide ($SiO_2$).

11. The method of claim 10, wherein forming the second material includes forming an oxide material containing nitrogen.

12. The method of claim 9, wherein the oxide material comprises nominally stoichiometric silicon dioxide ($SiO_2$), and wherein implanting the Si ions forms the second material as a silicon-rich oxide material containing a greater percentage of silicon than the oxide material.

13. A method of fabricating a semiconductor structure, comprising:
   forming a plurality of semiconductor fins on an upper surface of a semiconductor substrate, the semiconductor fins spaced apart from one another by a respective trench to define a fin pitch;
   depositing an oxide material in the trenches to form an oxide layer, the oxide material having a first etch resistance
   performing an ion implantation process to implant ions into the oxide material to convert a portion of the oxide layer into a second material to form a first protective layer having a second etch resistance that is different from the first etch resistance;
   applying a high density plasma (HDP) to a surface of the first protective layer to convert a portion of the first protective layer into a third material that is different from the oxide material and the second material, the third material forming a second protective layer having a third etch resistance that is different from the first and second etch resistances; and
   annealing the structure at temperatures below 900 degrees Celsius to further increase the etch resistance of both the second material and the third material,
   wherein a combination of the second material and the third material that has been annealed defines a multi-layer electrical isolation region.

14. The method of claim 13, wherein the ion implantation process includes implanting silicon (Si) ions into the oxide material to form the first protective layer, the first protective layer having a greater etch resistance than remaining non-modified portions of the oxide material.

15. The method of claim 14, wherein converting the portion of the first protective layer includes applying a nitrogen-containing HDP plasma to a surface of the first protective layer to form the second oxide protective layer containing nitrogen.

16. The method of claim 15, wherein the oxide material comprises nominally stoichiometric silicon dioxide ($SiO_2$).

17. The method of claim 16, wherein the second material of the first protective layer is a silicon-rich oxide material formed beneath the nitrogen-containing second protective layer.

* * * * *